US011469778B2

(12) United States Patent
Delfosse

(10) Patent No.: US 11,469,778 B2
(45) Date of Patent: Oct. 11, 2022

(54) ISOLATED FAULT DECODER

(71) Applicant: Microsoft Technology Licensing, LLC, Redmond, WA (US)

(72) Inventor: Nicolas Guillaume Delfosse, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 273 days.

(21) Appl. No.: 16/721,194

(22) Filed: Dec. 19, 2019

(65) Prior Publication Data

US 2021/0194507 A1   Jun. 24, 2021

(51) Int. Cl.
*H03M 13/00*   (2006.01)
*H03M 13/15*   (2006.01)
*G06N 10/00*   (2022.01)

(52) U.S. Cl.
CPC ........ *H03M 13/1575* (2013.01); *G06N 10/00* (2019.01)

(58) Field of Classification Search
None
See application file for complete search history.

(56) References Cited

U.S. PATENT DOCUMENTS

| | | | | |
|---|---|---|---|---|
| 9,978,020 | B1 * | 5/2018 | Gambetta | G06N 20/00 |
| 2016/0344414 | A1 * | 11/2016 | Naaman | H03M 13/1575 |
| 2019/0044542 | A1 * | 2/2019 | Hogaboam | G06N 3/0635 |
| 2020/0119748 | A1 * | 4/2020 | Lucarelli | G06N 10/00 |
| 2020/0274554 | A1 * | 8/2020 | Aspuru-Guzik | G06N 10/00 |
| 2020/0401927 | A1 * | 12/2020 | Nickerson | G06N 99/00 |
| 2021/0019223 | A1 * | 1/2021 | Chamberland | G06F 11/1048 |
| 2021/0125094 | A1 * | 4/2021 | Chamberland | G06N 10/00 |
| 2021/0125096 | A1 * | 4/2021 | Puri | G06N 10/00 |

OTHER PUBLICATIONS

"International Search Report and Written Opinion issued in PCT Application No. PCT/US20/058904", dated Feb. 16, 2021, 32 Pages.
Tannu, et al., "Taming the Instruction Bandwidth of Quantum Computers via Hardware-Managed Error Correction", In Proceedings of the 50th Annual IEEE/ACM International Symposium on Microarchitecture, Oct. 14, 2017, pp. 679-691.
Tomita, et al., "Low-Distance Surface Codes Under Realistic Quantum Noise", In Journal of Physical Review A, vol. 90, Issue 6, May 2, 2014, pp. 1-15.
Varsamopoulos, et al., "Decoding Surface Code with a Distributed Neural Network based Decoder", In Repository of arXiv:1901.10847v2, Feb. 6, 2019, 10 Pages.

* cited by examiner

*Primary Examiner* — Mujtaba M Chaudry
(74) *Attorney, Agent, or Firm* — Holzer Patel Drennan

(57) ABSTRACT

A quantum computing system includes a decoding unit that implements a low-cost "isolated fault decoder" in-line with a more sophisticated decoder in order to significantly reduce bandwidth consumption and a requisite amount of decoding hardware to perform error correction that achieves a target error correction rate. The isolated fault decoder receives a syndrome from a measurement circuit of the quantum computing system and implements logic to attempt to identify a set of faults that explain the syndrome and that also satisfy a fault isolation threshold restricting a proximity between each pair of faults in the set.

20 Claims, 12 Drawing Sheets

Decoding Graph for Three Syndrome Measurement Rounds

Decoding Graph for Three Syndrome Measurement Rounds

Decoding Graph for Three Syndrome Measurement Rounds

ISOLATED FAULT DECODER

BACKGROUND

The scalability of decoders for quantum error correction is an ongoing challenge in generating practical quantum computing devices. Hundreds or thousands of high-quality qubits with a very low error rate (e.g., $10^{-10}$ or lower) may be needed to implement quantum algorithms with industrial applications. Using current quantum technologies, these specifications cannot be met without using thousands of high-quality qubits that are each individually encoded in thousands of physical qubits such that there may exist millions of qubits running each computation of the quantum computer. Obtaining error rates currently required by industrial applications requires correcting, at regular intervals, errors that accumulate over these millions of qubits. Detecting and correcting these errors entails processing a massive amount of data, leading to significant challenges in bandwidth and hardware resource allocation.

SUMMARY

According to one implementation, a method for reducing decoding hardware and bandwidth in quantum error correction provides for implementation of a low-cost "isolated fault decoder" in-line with a more sophisticated decoder. The isolated fault decoder receives from a measurement circuit a syndrome including a plurality of trivial and non-trivial syndrome bits that provide information about one or more errors of a given type detected by measuring one or more qubits in a qubit register of a quantum computer. The isolated fault decoder implements logic to determine if the syndrome observed can be explained by a set of faults that satisfy a fault isolation threshold restricting a proximity between each pair of faults in the fault path. Other implementations are also described and recited herein.

DETAILED DESCRIPTION

The herein disclosed technology provides a low-bandwidth, lean hardware decoding solution for correcting errors detected in a qubit register of a quantum computer. According to one implementation, a quantum computer includes a readout device with two or more different decoders in-line (e.g., in a pipeline). Syndrome data is first provided to a simple hard-decision decoder referred to herein as a "isolated fault decoder." The isolated fault decoder implements logic to determine whether a detected error configuration is one that can be "easily" corrected. In one implementation, the isolated fault decoder implements logic to determine whether observed syndrome data can be explained by a fault path consisting of faults that are each separated from one another by a threshold spatial and/or temporal separation. When the hard decision succeeds, it returns a solution set defining locations for a minimum number of faults that may collectively explain the syndrome. This solution set is referred to herein as a minimum weight fault path.

If the isolated fault decoder is unable to identify a solution satisfying the above-described constraints with 100% confidence, the isolated fault decoder aborts its attempt to correct the errors and returns a failure mode. In this case, the syndrome data is sent to a primary decoder that implements a more sophisticated decoding algorithm suitable for achieving optimal or quasi-optimal performance (e.g., providing error correction in all cases with an error rate of $10^{-10}$ or lower).

In some implementations, the isolated fault decoder is able to determine a correction for 99% or more of the observed non-trivial syndromes. Consequently, use of the isolated fault decoder in the manner described herein reduces the bandwidth consumed by syndrome data at the price of a minor increase in the complexity of the quantum readout device due to the addition of an isolated fault decoder within the device. Since the primary decoder is, in the disclosed systems, performing less than 1% of all corrections, the proposed use of the isolated fault decoder also significantly reduces the amount of decoding hardware needed to achieve the precise error correction required by currently-proposed quantum industrial applications.

Figure 1:
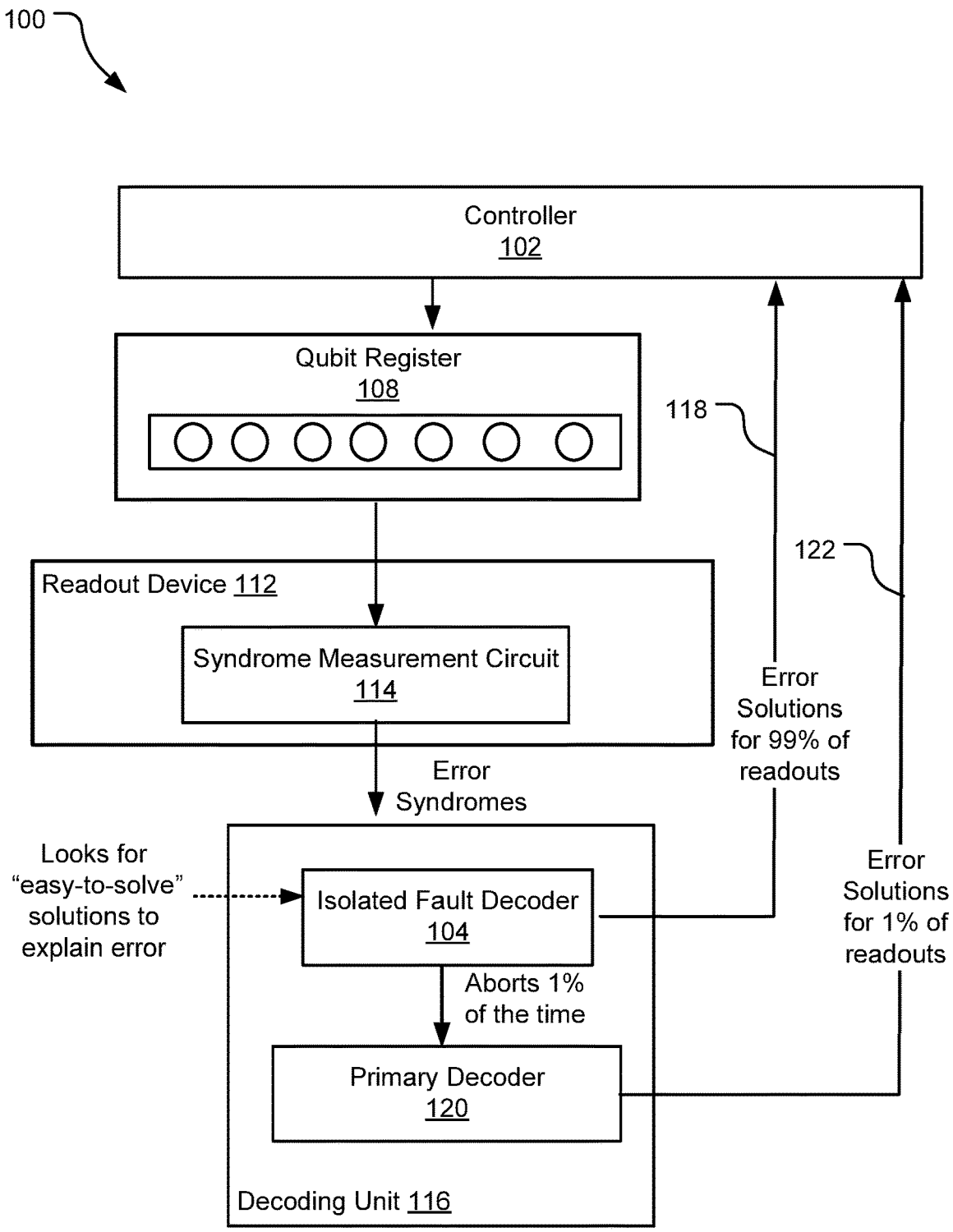
FIG. 1 illustrates an example quantum computing system that implements an isolated fault decoder in-line with a more sophisticated decoder in order to significantly decrease the amount of computing hardware needed to perform error correction for the quantum computing system.

FIG. 1 illustrates an example quantum computing system 100 that implements a first decoder referred to herein as a "isolated fault decoder 104" in-line with a more sophisticated, second decoder referred to herein as "primary decoder 106." The use of these two in-line decoders as described herein significantly decreases the amount of computing hardware needed to perform error correction within the quantum computing system as compared to an identical system implementing exclusively the primary decoder 120.

The quantum computing system 100 includes a controller 102 that performs calculations by manipulating qubits within a quantum register 102. Qubits are the fundamental units of information in quantum computers and are coupled to noisy environments (stray electromagnetic fields or material defects that can exchange energy with qubits). Imperfect quantum gate operations compound this problem, since quantum gates are unitary transformations chosen from a continuum of possible values and thus cannot be implemented with perfect accuracy.

The fundamentals of quantum computing rely on two quantum mechanical properties: superposition of qubits and entanglement of qubits. A qubit may be represented as a linear combination of its two basis states. If the basis states are $|0>$ and $|1>$, a qubit $|\psi>$ can be represented as $|\psi>=\alpha|0>+\beta|1>$, where $\alpha, \beta \in \mathbb{C}$ and $|\alpha|^2+|\beta|^2=1$. The state of a qubit changes when the magnitude or/and phase of the probability amplitudes $\alpha, \beta$ change. For example, a magnitude flip (or bit-flip) changes the state of $|\psi>$ to $\beta|0>+\alpha|1>$. Alternately, a phase-flip changes its state to $\alpha|0>-\beta|1>$. Quantum instructions modify the probability amplitudes using quantum gate operations that are represented using identity (I) and Pauli matrices. Pauli matrices X, Z, and Y denote the effects of bit-flip, phase-flip, or both respectively. As is discussed in detail below, many Quantum Error Correction Codes (QECC) use these matrices to both simulate and detect errors.

QECCs have been developed to protect quantum states from noise during measurement. In any QECC, logical qubits are encoded using several physical qubits to enable fault tolerant quantum computations. Fault tolerance incurs resource overheads (typically 20×-1000× per logical qubit) and is not practically feasible on the small prototype machines currently available. However, Quantum Error Correction is believed to be very valuable, if not outright necessary, in order to run useful applications on fault-tolerant quantum computers.

To enable fault tolerant quantum computation in the quantum computing system 100, a readout device 112 includes a syndrome measurement circuit 114 that applies QECCs to the qubits in the qubit register 108. Since measurement is known to destroy the delicate states of a qubit needed for computation, the syndrome measurement circuit 114 uses redundant qubits—known as "ancilla data bits" to perform computations. During quantum processing, entropy from the data qubits that encode the protected data is transferred to the ancilla qubits (sometimes also referred to as "measurement qubits") that can be discarded. The ancilla qubits are positioned to interact with data qubits such that it is possible to detect errors by measuring the ancilla qubits and to correct such errors using a decoding unit 116 that includes one or more decoders. In some implementations, the decoding unit 116 includes logic executed by one or more classical computing systems.

The syndrome measurement circuit 114 performs measurements of the ancilla bits in the quantum computer to extract syndromes providing information measured with respect to errors (faults). In order to avoid accumulation of errors during the quantum computation, the syndrome data is constantly measured, producing r syndrome bits for each syndrome measurement round. In one implementation, the syndrome data is measured with a frequency of every 1 µs.

The syndrome data is sent to the decoding unit 116, which implements one or more QECCs to analyze the syndrome data and to detect the location of each error and to correct each error within the syndrome measurement circuit 114. Within the decoding unit, an isolated fault decoder 104 receives each round of syndrome data and implements one or more quantum LDPC codes (a family of QECCs) to analyze the syndrome data. The family of quantum LPDC codes includes both surface codes and color codes for which the isolated fault decoder 104 is generally described. In other implementations, the isolated fault decoder 104 may be adapted to utilize other types of LPDC codes.

The isolated fault decoder 104 implements logic to determine whether the observed syndrome can be explained by one of a finite number of "easy-to-solve" solutions. According to one implementation, the isolated fault decoder 104 implements logic, at one or more rounds of measurement, to determine whether a minimum weight fault path exists to potentially explain an observed syndrome. As explained in greater detail with respect to FIG. 3 below, the isolated fault decoder 104 examines exclusively those fault paths consisting of isolated faults (e.g., there exists at least a predefined minimum spatial and/or temporal separation between each pair of fault paths in the solution set). If the isolated fault decoder 104 can identify such a solution with 100% confidence, the isolated fault decoder 104 outputs error solution information 118 that is usable by the controller 102 to correct all faults in the associated round of measurement. For example, the output error solution information 118 may identify fault locations and fault types (e.g., bit flip or phase flip) within the qubit register 108 that explain the observed syndromes, and the controller 102 may utilize such information to correct the data measured from the qubit register 108.

The isolated fault decoder 104 can be understood as a pre-decoder which only attempts to correct these "easy-to-solve" error configurations. If the isolated fault decoder cannot identify a solution set with 100% confidence, the isolated fault decoder 104 aborts the solution attempt and returns a failure mode. In that case, the syndrome data is sent to the primary decoder 120, which hosts a more sophisticated decoder that is more processor-intensive and/or more memory intensive than the isolated fault decoder 104. Many currently-known, sophisticated decoding algorithms are potentially suitable for implementation within the primary decoder 120 including the minimum-weight perfect matching (MWPM) decoder, parallel MWPM decoder, the Union-Find (UF) decoder, as well as other machine learning decoders or tensor network decoders. The primary decoder 120 outputs error solution information 122 that allows the controller 102 to correct more complex faults that cannot be explained or corrected for by a minimum fault correction.

In one implementation, the isolated fault decoder 104 implements logic that consists of a single loop over syndrome bits, making the isolated fault decoder 104 easy to parallelize and an ideal candidate for a low level hardware implementation with field-programmable gate arrays (FPGAs) or a complementary metal-oxide-semiconductor (CMOS) integrated circuit.

Although the isolated fault decoder 104 may be implemented in a variety of ways, one implementation integrates the isolated fault decoder 104 into a hardware unit placed as close as possible to the readout device 112 in order to avoid a long feedback loop increasing the physical qubit clock cycle. The primary decoder 120 may, in contrast, be placed at further distance from the qubit register 108 to avoid introducing additional noise into the quantum plane.

The use of the isolated fault decoder 104 as described herein reduces the bandwidth needed for error correction because, in most cases, the isolated fault decoder 104 takes care of the correction without any need for data to reach the primary decoder 120. According to one implementation, it is estimated that about 99% of the total measurement rounds have non-trivial syndromes that can be corrected by the isolated fault decoder 104 without employing the primary decoder 120. Moreover, the herein-described implementation of the isolated fault decoder 104 also allows for a significant reduction in the hardware (e.g., processing units and hardware) utilized to implement error correction since the isolated fault decoder 104 can be relied on a large fraction of the time. According to one implementation, the design disclosed herein is implementable to reduce the amount of decoding hardware needed by several orders of magnitude to achieve standard error rates of less than $10^{-3}$.

Figure 2:
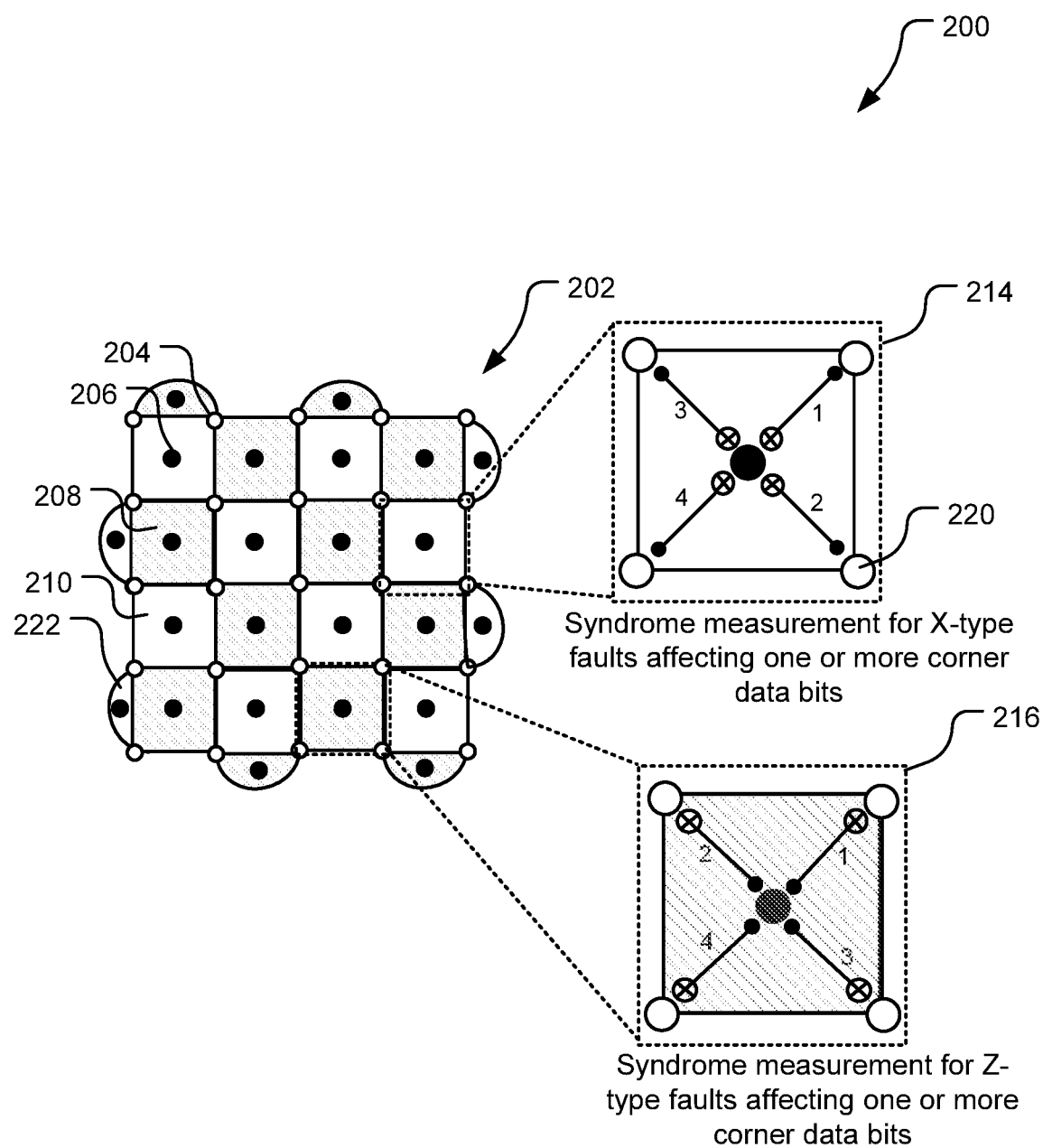
FIG. 2 illustrates an example portion of a syndrome measurement circuit that employs surface code to provide syndrome data to a decoding unit in a quantum computing device.

FIG. 2 illustrates an example portion of a syndrome measurement circuit 200 that employs surface code to provide syndrome data to a decoding unit in a quantum computing device. The syndrome measurement circuit 200 may be integrated within a quantum computing system to provide syndrome data to an isolated fault decoder, as discussed with respect to the syndrome measurement circuit 114 and the isolated fault decoder 104 of FIG. 1.

In one implementations, the syndrome measurement circuit 200 employs surface code to measure syndrome bits corresponding each of a plurality of ancilla qubits (e.g., an ancilla qubit 206) in the syndrome measurement circuit 200. In the surface code, physical qubits are entangled together using a sequence of physical qubit CNOT operations, with subsequent measurements of the entangled states providing a means for error correction and error detection. A set of physical qubits entangled in this way is used to define a logical qubit, which due to the entanglement and measurement has far better performance than the underlying physical qubits.

In FIG. 2, the syndrome measurement circuit 200 encodes a single logical qubit onto a square grid 202 of d×d data qubits, where d is referred to as the minimum distance of the surface code. In the example of FIG. 2, the grid 202 represents a two-dimensional distance-3 surface code. In the simplest realization, a surface code of distance d uses $(2d-1)^2$ qubits to store a single logical qubit, where d is a measure of redundancy and error tolerance. A larger code distance results in greater redundancy an d increased error tolerance. Thus, the square grid 202 shown may be understood as representing a single logical qubit that is one of many different logical qubits measured by the syndrome measurement circuit 200 in the quantum computing system.

In the particular representation shown, data qubits are shown by hollow circles on vertices of the grid (e.g., a data qubit 204) and ancilla qubits are represented by filled circles (e.g., the ancilla qubit 206), each centered on the face of an associated one of multiple different square plaquettes (e.g., a square plaquette 208) and on boundary faces (e.g., a boundary face 222). Error correction is based on the measurement of $r=d^2-1$ syndrome bits that are extracted from a qubit register by the syndrome measurement circuit 200.

As background, it is noted that the logical qubit (e.g., the grid 202) may be understood as having redundant data spread out over many data qubits in order to provide better measurement accuracy. This concept arises from Shor's error correction code, also called repetition code, which works by encoding a logical qubit into nine physical qubits using the following definitions:

$$|0_L\rangle \rightarrow |\bar{0}\rangle = (|000\rangle + |111\rangle) \otimes (|000\rangle + |111\rangle) \otimes (|000\rangle + |111\rangle)$$

$$|1_L\rangle \rightarrow |\bar{1}\rangle = (|000\rangle + |111\rangle) \otimes (|000\rangle + |111\rangle) \otimes (|000\rangle + |111\rangle)$$

In the above example, the data is no longer stored in a single qubit but is instead spread out among nine qubits. A bit flip can then be detected and corrected based on "majority voting" (e.g., the state $|100\rangle + |011\rangle$ with an error on the leftmost qubit is returned to $|000\rangle + |111\rangle$ but returned correctly on the other qubits). Similarly, phase flips may be detected based on sign changes between the groupings of three qubits. The number of physical qubits need to define a logical qubit is strongly dependent on the error rate in the physical qubits.

In general, quantum circuits apply a sequence of quantum operations (gates and measurements) on n qubits in a quantum register. The herein disclosed technology contemplates error correction to quantum circuits that apply two either single-qubit quantum operations or two-qubit quantum operations (e.g., operations on either one or two qubits at once). A single-qubit quantum operation on qubit i at time step t defines a circuit location $\{(i, t)\}$ (where time is a dimension not shown in FIG. 2). A qubit that does not support gate or measurement operations is referred to as a "waiting qubit" and is considered to be a single-qubit operation (the identity operation). A two-qubit quantum operation on qubits i and j at time step t defines a circuit location $\{(i, t), (j, t)\}$.

In the syndrome measurement circuit 200 of FIG. 2, qubit errors can be modeled by introducing random X bit-flip and Z phase-flip operations in the evolution of the qubit state where X and Z are the Pauli X-gate and the Pauli Z-gate, respectively. Note, the Pauli-Y gate is the combination $\hat{Y}=\hat{X}\hat{Z}$, and is thus usable to model a combined bit flip error and phase flip error. The operator model for correcting single-qubit errors implies that these errors can, in principle, by undone by applying the X and Z correction gates (e.g., an erroneous Z-type error can be canceled by subsequently applying an intentional $\hat{Z}$, since $\hat{Z}^2=\hat{I}$ (the identity matrix). It has been shown previously that as long as Clifford gates are applied on qubits, there is no need to perform active error correction. Instead, keeping track of Pauli frames in software is sufficient. Thus, the primary focus of quantum error correction is error decoding, rather than error correction. In general, quantum error decoders receive a syndrome measurement as input and return an estimation of the error in data qubits.

In FIG. 2, circuit level noise for the syndrome measurement circuit 200 noise is generated to simulate imperfections on all qubits during every gate and waiting step. This noise in the underlying quantum circuit is simulated by injecting a random Pauli fault between each two steps in the quantum circuit. As used herein, the term "fault" refers to a Pauli error that occurs in a given location and that occurs during a quantum operation.

The syndrome measurement circuit 200 utilizes two types of ancilla qubits referred to herein respectively as "measure-Z" qubits (centered on plaquettes with shaded faces, such as shaded plaquette 208) and "measure-X" qubits (centered on plaquettes with unshaded faces, such as unshaded plaquette 210). In surface code literature, the measure-Z and measure-X qubits are sometimes called Z syndrome and X syndrome qubits. In the surface code configuration of FIG. 2, each measure-X and measure-Z qubit (e.g., each solid filled circle in FIG. 3) is coupled to four data qubits (e.g., the four nearest hollow circles). Further, each data qubit (e.g., each filled solid circle) is coupled to two measure-Z qubits and two measure-X qubits (e.g., the four nearest solid filled circles).

A measure-Z qubit is used to force is used to force its neighboring data qubits a, b, c, and d into an eigenstate of the operator product $\hat{Z}_a, \hat{Z}_b, \hat{Z}_c, \hat{Z}_d$. Likewise, a measure-X qubit is used to force is used to force its neighboring data qubits a, b, c, and d into an eigenstate of the operator product $\hat{X}_a, \hat{X}_b, \hat{X}_c, \hat{X}_d$. Each measure-Z qubit therefore measures what is known as a Z-stabilizer and each measure-X qubit measures what is known as an X-stabilizer. Stabilizers (e.g., the X-stabilizer and the Z-stabilizer) are very important in preserving quantum states. By repeatedly measuring a quantum system using a complete set of commuting stabilizers, the syndrome measurement circuit 200 forces the data bits associated with each measure-X and measure-Z qubit into a simultaneous and unique eigenstate of all of the stabilizers allowing one to measure the stabilizers without perturbing the system. When the measurement outcomes change, this corresponds to one or more qubit errors and the quantum state is projected by the measurements onto a different stabilizer eigenstate.

The measurement of each measure-Z and measure-X qubit is performed by implementing a sequence of operations in a very particular order. One complete cycle of these operations to measure a syndrome value for a measure-X qubit is shown with respect to view 214. Likewise, one complete cycle of these operations to measure a syndrome value for a measure-Z qubit is shown with respect to view 216. After initializing each ancilla qubit (e.g., the measure-X qubits and measure-X qubits) in its ground state |g), the sequence comprises four CNOT operations followed by a projective measurement. For the measure-Z qubit, the CNOTs target the measure qubit with the four nearest-neighbor data qubits as the controls, with the projective measurement yielding an eigenstate of $\hat{Z}_a, \hat{Z}_b, \hat{Z}_c, \hat{Z}_d$. For the measure-X qubit, the four CNOTs target the nearest-neighbor data qubits using the measure qubit as the control, and the sequence also includes a Hadamard applied to the measure qubit before and after the CNOTs. The projective measurement yields an eigenstate of $\hat{X}_a, \hat{X}_b, \hat{X}_c, \hat{X}_d$. Hence, after the projective measurement of all the measure qubits in the grid 202, the state $|\psi\rangle$ of all of the data qubits simultaneously satisfies $\hat{Z}_a\hat{Z}_b\hat{Z}_c\hat{Z}_d|\psi\rangle = \hat{Z}_{abcd}|\psi\rangle$, with eigenvalues $\hat{Z}_{abcd} = \pm 1$, and $\hat{X}_a\hat{X}_b\hat{X}_c\hat{X}_d|\psi\rangle = \hat{Z}_{abcd}|\psi\rangle$, with eigenvalues $\hat{X}_{abcd} = \pm 1$. Following measurement, the cycle is repeated. The measurement of all ancilla qubits in the grid 202 (e.g., forming a same logical qubit) is performed so that every step in the cycle shown in view 214 is completed over the entire 2D array before the next step begins.

In FIG. 2, the surface code encoding provides a logical qubit (represented by grid 202) whose error level drops to equation (1) below:

$$p_L(p,d) = 0.1(100p)^{(d+1)/2} \quad (1)$$

where d is the surface code minimum distance and p is the rate of circuit level noise affecting the qubits and quantum gates within the circuit. Assuming that the physical error rate p is known, one can use this formula to estimate the minimum distance d required to achieve a target local error rate. Many practical applications currently necessitate a logical error rate that varies between $10^{-1}$ and $10^{-15}$, which is out of reach with current hardware solutions without powerful error correction.

During a single measurement of all measure-X and measure-X qubits in the grid 202, a syndrome S is extracted where S is a three-dimensional array of 0 and 1 values. Each value in the array S corresponds to a measurement location in the syndrome measurement circuit 200. In general, a trivial syndrome ('0') indicates non-detection of a fault at the corresponding circuit location while a non-trivial syndrome ('1') indicates that a fault has been detected at the corresponding circuit location.

It may be appreciated that the trivial syndrome bits do not necessarily indicate an absence of fault on nearby circuit locations. For instance, in cases where an even number of faults affect a measured ancilla bit, the corresponding measured syndrome bit may appear trivial. Operations for identifying and correcting these types of faults (e.g., even-numbered faults occurring in close proximity) exceed the scope of the present application and are not intended to be handled by the isolated fault decoder described herein.

According to one implementation, the syndrome measurement circuit 200 outputs the syndrome array S of bits to an isolated fault decoder, such as the isolated fault decoder 104 described and shown with respect to FIG. 1. The isolated fault decoder separately analyzes the Z-type faults (e.g., syndrome values corresponding to ancilla bits on the shaded plaquette faces) and the X-type faults (e.g., the syndrome values corresponding to the ancilla bits on the unshaded plaquette faces). Example operations of the isolated fault decoder are discussed in detail with respect to FIG. 3.

Figure 3:
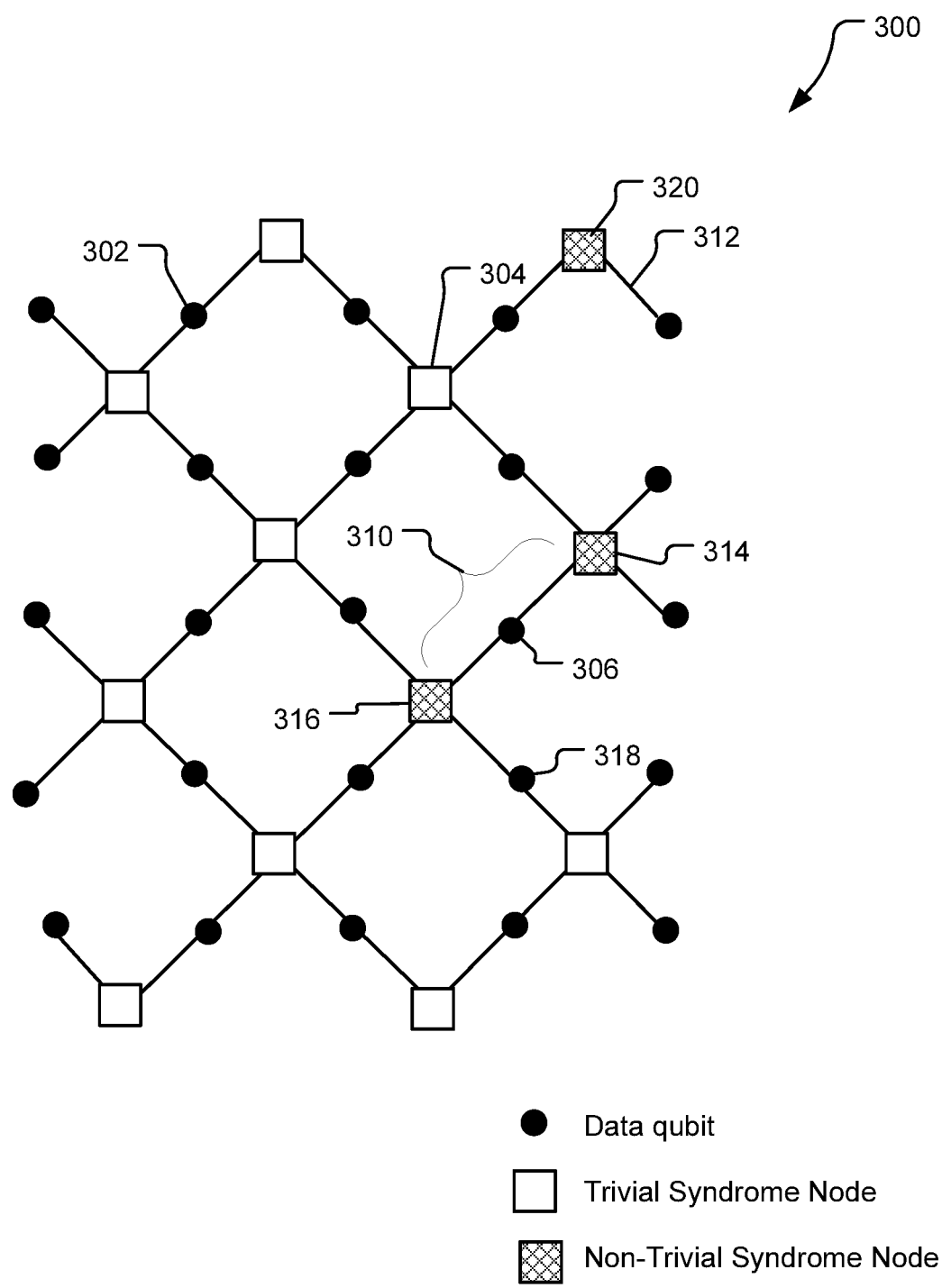
FIG. 3 illustrates an example decoding graph that represents all possible faults of a given type that may occur within a syndrome measurement circuit.

FIG. 3 illustrates an example decoding graph 300 that represents all possible faults of a given type (e.g., either Z-type or X-type) that may occur within a syndrome measurement circuit, such as the syndrome measurement circuit 200. In one implementation, an isolated fault decoder (e.g., isolated fault decoder 104 of FIG. 1) constructs the decoding graph 300 responsive to receiving a syndrome array S including syndrome measurement bits corresponding to the ancilla bits in the syndrome measurement circuit.

For simplicity, the example decoding graph 300 of FIG. 3 illustrates a 2-dimensional slice of the syndrome array S for a single logical bit in the syndrome measurement circuit. Here, the decoding graph 300 illustrates the syndrome measurement bits corresponding to a set of i, j circuit locations for which a same type of fault information is measured (e.g., the decoding graph 300 illustrates exclusively one of Z-type faults or X-type faults, but can be constructed for either). It should be understood that the decoding graph 300 may actually be three-dimensional where the third dimension represents time and repeated syndrome bit measurements at the locations defined by the set of circuit locations (i, j).

The decoding graph 300 logically corresponds to the syndrome measurement circuit 200 shown in FIG. 2 in that it includes squares ("nodes") representing syndrome measurement bits (e.g., the ancilla qubits of FIG. 2). These nodes are referred to herein as "syndrome nodes." Each pair of syndrome nodes is connected by an edge (e.g., an edge 310). Data qubits are indicated by filled circles (e.g., a data qubit 302) on each edge. These data qubits each represent a potential fault location.

In one implementation, the syndrome nodes in the decoding graph 300 each correspond to a respective one of the ancilla qubits that are of a same fault type (e.g., measure-X or measure-X) from the syndrome measurement circuit of FIG. 2. For example, the set of syndrome bits shown in FIG. 3 may be drawn by placing a syndrome bit on each of the measure-X qubits (e.g., the ancilla qubits that are centered on shaded plaquettes) in the syndrome measurement circuit 200 of FIG. 2.

Notably, the isolated fault decoder considers one type of error at a time. Thus, in the situation where the syndrome bits in the array S correspond to measure-X qubits, the decoding graph 300 does not includes syndrome nodes that correspond to measure-Z qubits. Since the isolated fault decoder attempts to detect and correct X-type and Z-type faults separately, the following description discusses X-type faults alone for simplicity. However, it should be understood that same or similar operations described below with respect to detection and correction of X-type faults may be performed separately to detect and correct Z-type faults.

Each of the syndrome nodes (e.g., syndrome node 304) shown in the decoding graph 300 corresponds to either a '0' value representing a trivial syndrome bit or a '1' value indicating non-trivial syndrome bit. These bits provide information about the relative locations of faults occurring within the underlying quantum circuit. For each fault occurring, a non-trivial syndrome bit may be observed in either one or two locations. A fault detected in a single location v induces what is referred to as a "half edge, described by {u, -}; and a fault detected in two locations, described by indices u and v, defines what is referred to herein as a "full edge" {u, v}. For example, a half edge 312 may be associated with a fault that has been detected in a single syndrome bit 320. A full edge 310 may be is associated with a fault detected in both of syndrome nodes 314 and 316.

As used herein, a fault path in the decoding graph 300 describes a set of faults for a given set of adjacent circuit locations. Each fault path includes a set of edges in the decoding graph that extend between a pair of two non-trivial syndrome nodes. For example, an X-type fault affecting a data qubit 306 lies along a fault path consisting of the edge 310. This edge 310 is an example of a fault path that connects together two non-trivial syndrome nodes 314, 316. Although not shown, it may be understood that some naturally-occurring fault paths may extend along several different edges intersecting one or more non-trivial syndrome nodes. The isolated fault decoder is not designed to provide fault correction in these more complex scenarios.

The objective of the isolated fault decoder is to identify a set of most-likely fault paths that explain the full syndrome S for X-type measurements received from the syndrome measurement circuit. Finding a most likely fault path to explain each non-trivial syndrome in the syndrome array S is mathematically complicated; however, it is mathematically much simpler to attempt to identify what is referred to herein as a "minimum weight fault path" in association with each non-trivial syndrome bit. Here, the term "weight" is used to refer to the number of faults in the path. Accordingly, a "minimum weight fault path" is a fault path that explains an observed syndrome with a fewest-possible number of faults.

Statistically, a minimum weight fault path is very close to being the most likely fault path between two non-trivial syndrome bits. According to one implementation, the isolated fault decoder attempts to identify a fault path (e.g., a set of faults) for the syndrome array S that is the minimum weight fault path for that syndrome.

Cases where multiple faults occur along a single fault path can be complex to solve, particularly when multiple faults occurs in a same localized area of the syndrome measurement circuit. However, these scenarios are statistically rare. According to one implementation, the isolated fault decoder does not consider solutions where there exist multiple faults on a same fault path in proximity closer than defined threshold separation. Rather, the isolated fault decoder attempts to identify a minimum weight fault path that explains the observed syndrome S and that only includes faults that satisfy a fault isolation threshold. As used herein, a fault path (e.g., a set of faults) is said to satisfy the fault isolation threshold when each identified fault in the fault path is separated from all other faults in the fault path by at least one edge. For example, a fault with faults on adjoining edges does not satisfy the fault isolation threshold.

The isolated fault decoder is capable of correcting, with 100% confidence, any minimum weight fault path satisfying the fault isolation threshold. The basic idea the isolated fault decoder is to correct all configurations that can be explained by a single fault and corrected locally (e.g., the faults are sufficiently isolated from one another). This guarantees a high potential for parallelism. If faults are sufficiently separated from each other in space and time, a globally minimal solution can be obtained from locally optimal sub-solutions.

When the isolated fault decoder succeeds, the set of edges returned define a minimum weight fault path consisting of a set of faults that collectively satisfy the isolation threshold (e.g., all faults in the minimum weight fault path are separated from each other by at least one edge of the decoding graph 300). In these cases, it can be proven that when the isolated fault decoder succeeds, the returned set of edges explains the syndrome S with 100% confidence. When the isolated fault decoder fails, it returns a failure mode.

Algorithm 1, below, details example logic for an isolated fault decoder of the above-described architecture. Here, it is assumed that a syndrome set S is an input to Algorithm 1. This syndrome set S is induced by faults of a same fault type (e.g., X-type faults), and the algorithm returns either an estimation of the set of edges supporting the faults (e.g., a minimum weight fault path) or a failure mode.

TABLE 1

Algorithm 1

Input: Set W of non-trivial syndrome bits in syndrome S
Output: Either a set of edges ε or a failure
   Initialize ε = 0
   For each non-trivial syndrome bit v ∈ W, do:
   {
      If v has a neighbor u in set W, add {u, v} to ε and remove u and v from set W
      //pairing defines potential minimum fault path
      Else if v is a boundary
      {
         Add the half-edge {v, -} to ε
         If v initially had a neighbor u in W but u is no longer in W
         // this indicates an ambiguous fault location
         {
            $N_{amb}$++
            // Increment count of total number of ambiguous half-edges TABLE 1-continued Algorithm 1

```
      }
   }
   Else return failure
}
If the number of ambiguous half-edges in ε is >1, return failure
Else return ε
```

Algorithm 1 (above) attempts to identify a minimum weight fault path that explains the observed syndrome S by implementing a loop that is repeated for each non-trivial syndrome node in an array W. For a given non-trivial syndrome node (v) in the array W, the algorithm determines whether the non-trivial syndrome node (v) has a neighboring non-trivial syndrome node (u) in the decoding graph. As used herein, two bits or nodes (u and v) are said to be "neighbors" or "neighboring" with respect to the decoding graph 300 when separated by a single edge.

When a neighboring pair of non-trivial syndrome nodes u, v can be identified, the connecting edge {u, v} is added to an estimation array E and the associated non-trivial syndrome nodes u and v are removed from the array W. This edge {u, v} represents a potential fault location that explains the two neighboring non-trivial syndrome nodes at its endpoints. If any one of the non-trivial syndrome nodes in the array W cannot be matched to a neighboring non-trivial syndrome node u that is still remaining in the set W, the algorithm determines whether the non-trivial syndrome node corresponds to a boundary in the decoding graph (e.g., an node connecting to a half edge 312 at the edge of the graph).

If the non-trivial syndrome node does correspond to a boundary node, the algorithm adds a half-edge {v, -} to the solution set and next determines whether the associated half-edge is "ambiguous" (e.g., associated with an ambiguous fault location). A half-edge is said to be "ambiguous" in scenarios where the connected non-trivial boundary node (v) initially had a neighbor node (u) in the set of non-trivial nodes W but the neighbor node (u) has since been removed from the set W. This makes the location of the fault ambiguous because it is equally possible that either (1) the fault may have been only observed at the boundary node (v) or, instead, (2) the fault may have been observed at both of boundary node (v) and neighboring node (u). If the algorithm determines that the half edge {v, -} is an ambiguous fault location, a variable, $N_{amb}$, is incremented, representing the total number of ambiguous half-edges in the solution set.

If at any point in time, a non-trivial syndrome node is identified that (1) cannot be matched to a neighboring non-trivial syndrome node still remaining in the set W; and (2) that is not on a boundary of the decoding graph 300, the algorithm returns a failures and does not attempt to solve for the fault path explaining the syndrome S.

In cases where all non-trivial syndrome nodes in the array W can be successfully matched to a neighboring non-trivial syndrome bit, the estimation array E represents a set of edges defining a minimum weight fault path that explains the observed syndrome and that also satisfies a fault isolation threshold under which each fault in the fault path is separated from all other faults in the fault path by at least one edge.

In all remaining cases, the algorithm proceeds to determine whether the number of ambiguous pairings in the estimation array E is greater than 1. If so, the algorithm returns a failure. It has been proven that, when Algorithm 1 returns a set of edges E including a single ambiguous half-edge, the ambiguous half-edge can be solved for and a globally optimal solution can be guaranteed. When Algorithm 1 returns a set of edges E that includes more than one ambiguous half-edge, this guarantee does not exist.

In none implementation, the syndrome S provided to the decoder includes three consecutive rounds of syndrome values. For example, the syndrome array S is of the form {i, j, t} where t=3. When a failure of the isolated fault decoder is detected, the syndrome array S is sent to primary decoder (e.g., the primary decoder 120 of FIG. 1), which accumulates d rounds of syndrome data to provide a correction.

Proof 1, below in table 2, demonstrates that when the isolated fault decoder succeeds, it returns, with 100 confidence, a true minimum weight fault path for the syndrome S.

TABLE 2

Proof. For a given fault set ε defined such that $\bar{s}(\varepsilon) = \bar{s}$ for a syndrome set $\bar{s}$, the fault set ε contains a set of paths that connect vertices of $\bar{s}$ either by pairs or to the boundary. Natively, it is true that $|\varepsilon| \geq |\bar{s}|/2$, with quality if an only if $\bar{s}$ pairs each vertex of $\bar{s}$ with one of its neighbors.
Let $\partial \bar{s}$ be the set of vertices v of $|\bar{s}|$ incident to a half-edge {v, -}. Consider the subset $\partial \bar{s}^* \subset \partial \bar{s}$ of vertices v that have no neighbor in $\bar{s}$ (that is $N_v \cap \bar{s} = 0$) where $N_v$ is a set of neighbors of vertex v. For an arbitrary fault set $\varepsilon \subset E$, any vertex of $\partial \bar{s}^*$ is either part of a half-edge or it is connected to a vertex at distance ≥ 2, leading to the bound:
$$|\varepsilon| \geq |(\bar{s}| - |\partial \bar{s}^*|)/2 + |\partial \bar{s}^*| \qquad (1)$$
This equation is satisfied for all fault set ε with syndrome $\bar{s}$.
Consider now the fault set ε produced by Algorithm 1 in case of success. In this case, edges are found that match all bulk vertices $v \in \partial \bar{s}/\partial \bar{s}^*$ to a neighbor except at most one. This is because in this case the number of ambiguous choices (boundary nodes) $(N_{amb}) \leq 1$.
This proves that the set ε returned by algorithm 1 in cases of success satisfies:
$$|\varepsilon| \geq |(\bar{s}| - |\partial \bar{s}^*|)/2 + |\partial \bar{s}^*| + \tfrac{1}{2} \qquad (2)$$
Together with the lower bound (1), this demonstrates that the size of ε is minimum.

Figure 4:
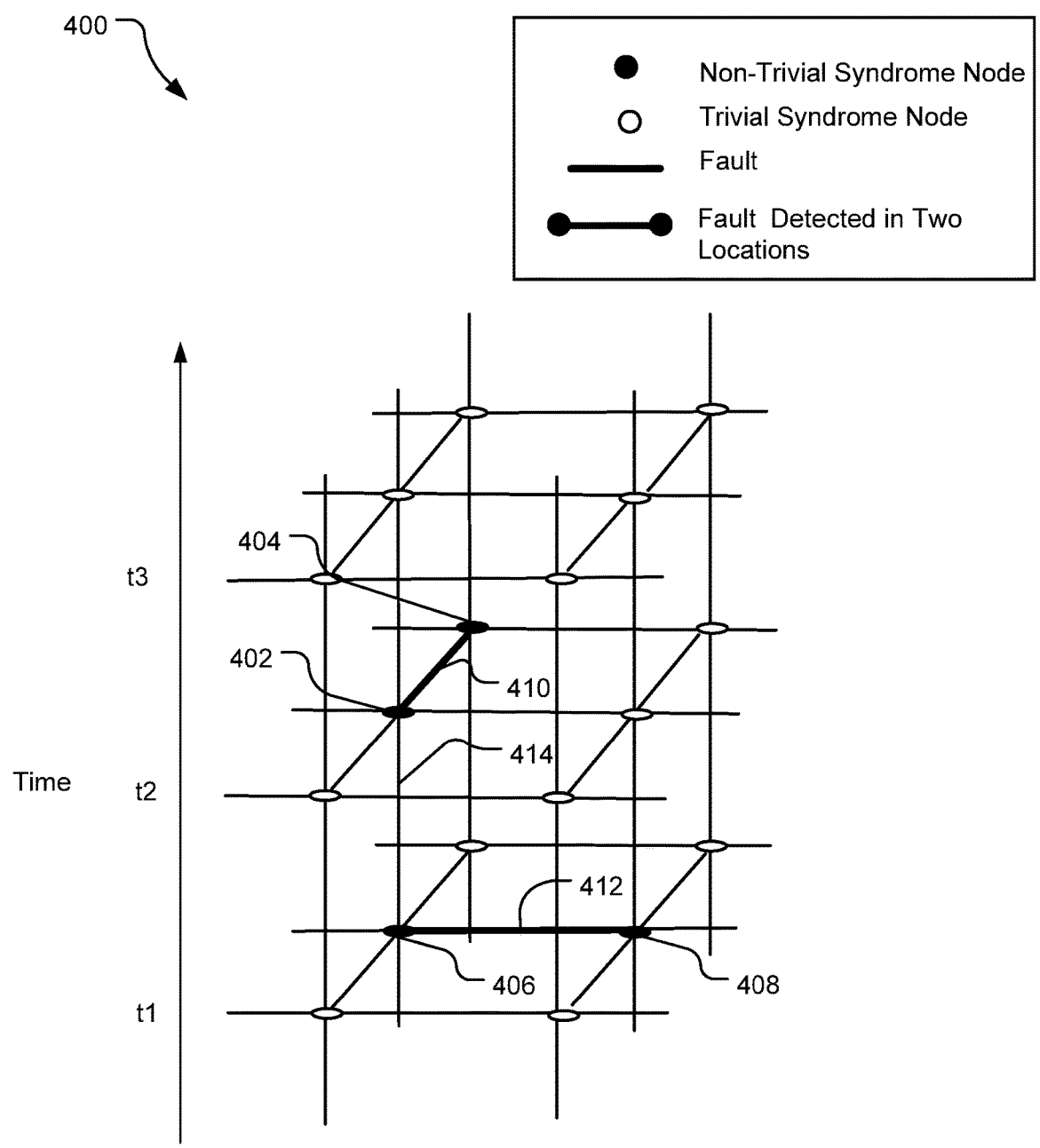
FIG. 4 illustrates an example portion of a three-dimensional decoding graph generated by an isolated fault decoder within a quantum computing system responsive to receiving an array of syndrome bits S from a syndrome measurement circuit in a quantum computing system.

FIG. 4 illustrates an example portion of a three-dimensional decoding graph 400 generated by an isolated fault decoder (e.g., the isolated fault decoder 104 in FIG. 1) within a quantum computing system responsive to receiving an array of syndrome bits S from a syndrome measurement circuit in a quantum computing system. Aspects of the quantum computing system, syndrome measurement, and isolated fault decoder not explicitly described below with respect to FIG. 4 may be the same or similar to those described with respect to FIG. 1-3.

In FIG. 4, the array of syndrome bits S, also referred to below as simply "the syndrome," is a three-dimensional vector of the form S=[i, j, t], where i and j refer to locations in a quantum circuit and t represents time. All bits within the array S are of a same fault type. If, for example, the isolated fault decoder is solving for X-type faults, the bits in the array S are x-type fault syndromes. Alternatively, if the isolated fault decoder is solving for Z-type faults, the bits in the array S are z-type fault syndromes.

The decoding graph 400 is comprised of nodes and edges where each node represents a determined syndrome bit value, and the edges connect neighboring nodes. The relative arrangement of the nodes within the decoding graph represents the relative arrangement of corresponding ancilla bits within the syndrome measurement circuit. For example, two neighboring nodes in the decoding graph 400 correspond to two ancilla bits measuring a same type of fault (x-type or z-type) that are at neighboring circuit locations separated by a single data qubit.

Each edge in the decoding graph 400 may be understood as representing a single-bit or two-bit quantum operation. In the example shown, the decoding graph 400 represents three measurement rounds (t1, t2, t3) performed by the syndrome measurement circuit. In the particular example of FIG. 4, the decoding graph 400 includes four non-trivial syndrome nodes 402, 404, 406, and 408. These are indicated by filled circles at node locations on the graph. All other nodes in the syndrome are trivial and are represented by open circles.

Responsive to receipt of the syndrome S, the isolated fault decoder implements logic outlined above with respect to FIG. 3 and/or algorithm 1 shown in Table 1, and begins to loop through a subset of syndrome consisting of unpaired non-trivial syndrome nodes 402, 404, 406, and 408. The isolated fault decoder first assesses the non-trivial syndrome node 402 and determines that it has a neighboring non-trivial syndrome node 404; thus, nodes 402 and 404 are paired together and a connecting edge 410 is added to a solution set. Here, the edge 410 represents an identified fault path on which a single fault has a occurred. The nodes 402 and 404 are then removed from the subset of unpaired non-trivial syndrome nodes, leaving only the nodes 406 and 408. The isolated fault decoder determines that the remaining non-trivial syndrome nodes 406 and 408 are neighbors; thus, nodes 406 and 408 are paired together and a connecting edge 412 is added to the solution set.

At this point, all non-trivial nodes in the decoding graph 400 have been matched with a neighboring non-trivial node and, through this matching, the isolated fault decoder has identified a single fault located on the edge 410 and another single fault location on the edge 412. Here, edges 410 and 412 represent a complete set of faults (e.g., a minimum weight fault path) that fully explains the syndrome S. Further, as a consequence of the logic set forth in Algorithm 1, the faults within the fault path are along edges separated from one another by at least one edge (e.g., edge 414) in the decoding graph. Therefore, the solution set also satisfies a minimum isolation threshold requiring that the faults in the minimum weight fault path (e.g., the solution set) be separated by at least one edge.

The isolated fault decoder returns the identified weight fault path (e.g., edges 410 and 412) to a system controller that, in turn, corrects the data measured in the quantum circuit. If, for example, the decoding graph 400 represents X-type faults, the fault along each one of the edges 410 and 412 can be corrected by multiplying the corresponding ancilla qubit by the Pauli-X matrix.

Figure 5:
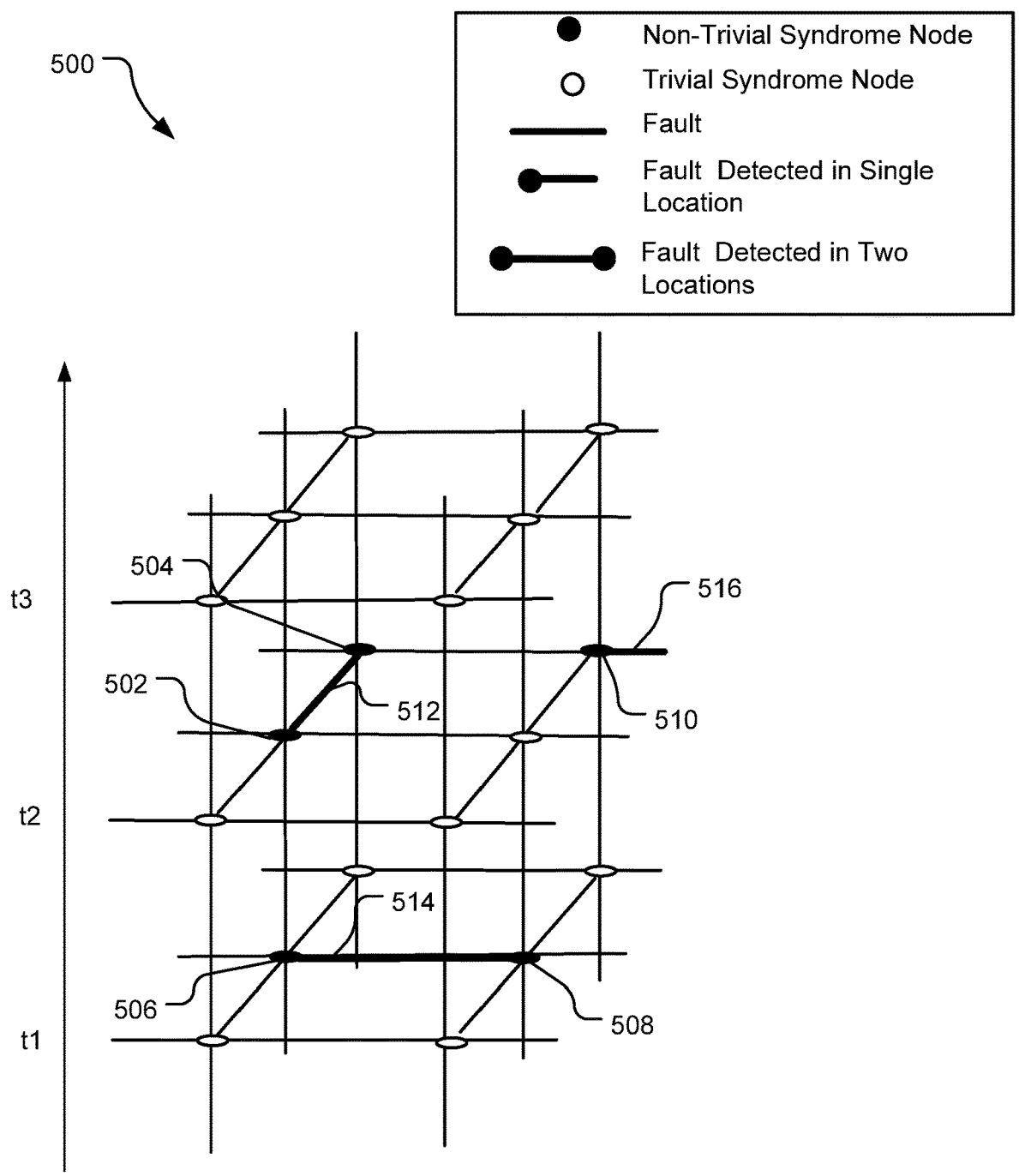
FIG. 5 illustrates an example portion of yet another three-dimensional decoding graph generated by an isolated fault decoder within a quantum computing system.

FIG. 5 illustrates an example portion of yet another three-dimensional decoding graph 500 generated by an isolated fault decoder (e.g., an isolated fault decoder 104 in FIG. 1) within a quantum computing system responsive to receiving an array of syndrome bits S from a syndrome measurement circuit in a quantum computing system.

The syndrome S illustrated by the decoding graph 500 represents a variation on the example of FIG. 4. In this case, the decoding graph 500 includes five non-trivial syndrome nodes 502, 504, 506, 508, and 510. Again, the isolated fault decoder loops through the logic of Algorithm 1. Here, an initial array of unpaired non-trivial syndrome nodes consists of 502, 504, 506, 508, and 510. In the same manner described above with respect to FIG. 4, the isolated fault decoder identifies the two pairs of neighboring nodes. Here, nodes 502 and 504 are paired together and removed from the array of unpaired non-trivial syndrome nodes. A connecting edge 512 is added to the solution set. Likewise, nodes 506 and 508 are paired together and removed from the array of unpaired trivial syndrome nodes. A connecting edge 514 is added to the solution set.

At this point in time, the node 510 is the only remaining unpaired non-trivial syndrome node. The isolated fault decoder determines that the node 510 represents a boundary node, and the half-edge 516 is added to the solution set. The isolated fault decoder further determines that the half-edge 516 represents an ambiguous fault location due to the fact that the node 510 is neighbors with another non-trivial syndrome node 504 that has already been paired (e.g., with node 502) per the above logic. Accordingly, the total number of ambiguous half-edges is incremented from 0 to 1.

Since, in this case, there exists a single ambiguous half-edge in the solution set, the isolated fault decoder is able to determine, with confidence (e.g., based on Proof 1 above in Table 2), that the solution set represents the minimum weigh fault path. Here, the isolated fault decoder has again succeeded and returns the set of faults included in the minimum weight fault path (e.g., edges 512, 514, and the half-edge 516) to a system controller that, in turn, corrects the data measured in the quantum circuit.

Aspects of the quantum computing system, syndrome measurement, and isolated fault decoder not explicitly described below with respect to FIG. 5 may be the same or similar to those described with respect to FIG. 1-4.

Figure 6:
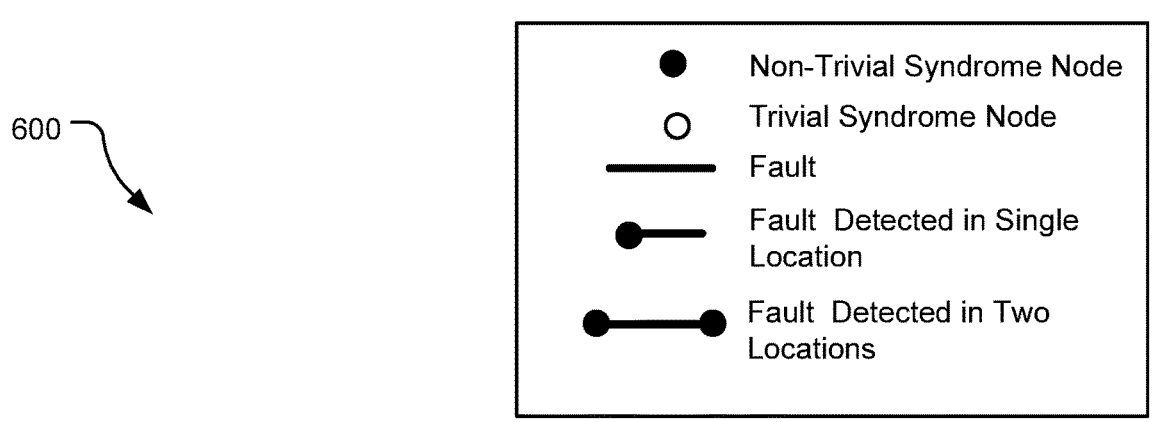
FIG. 6 illustrates an example portion of yet another three-dimensional decoding graph generated by an isolated fault decoder within a quantum computing system.
Figure 6:
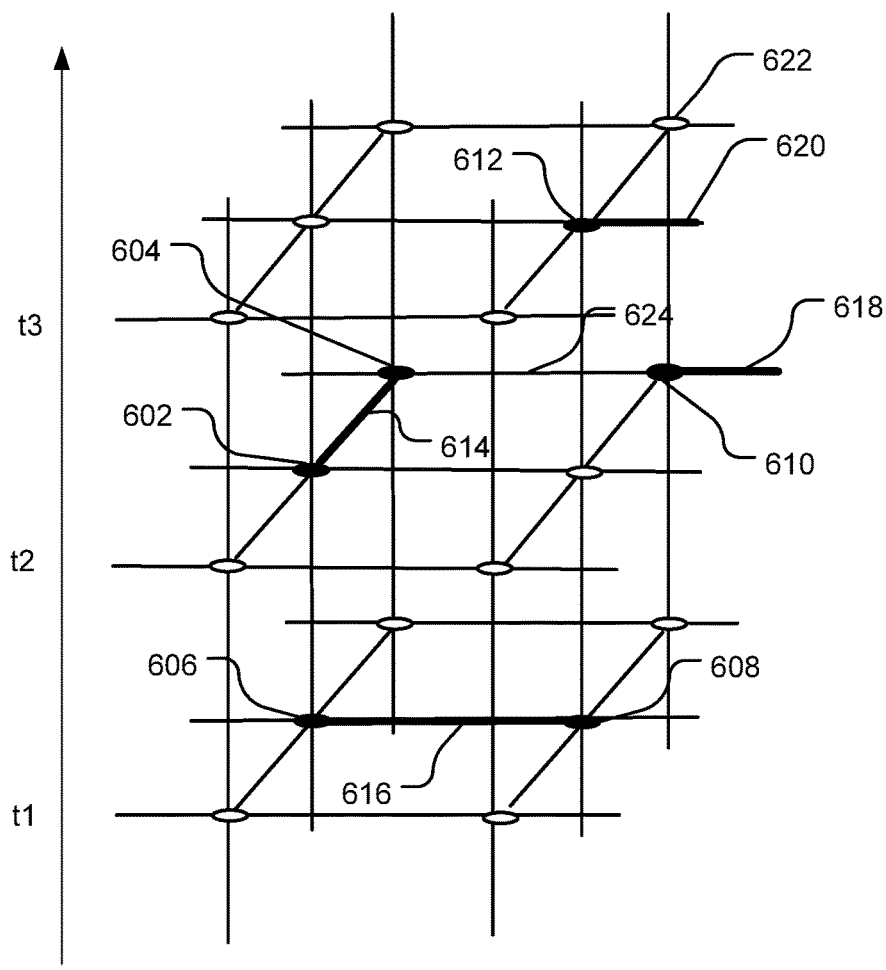

FIG. 6 illustrates an example portion of yet another three-dimensional decoding graph 600 generated by an isolated fault decoder (e.g., an isolated fault decoder 104 in FIG. 1) within a quantum computing system responsive to receiving an array of syndrome bits S from a syndrome measurement circuit in a quantum computing system. The syndrome S illustrated by the decoding graph 600 represents another variation on the examples of FIGS. 4-5. In this case, the decoding graph 600 includes six non-trivial syndrome nodes 602, 604, 606, 608, 610, and 612. Again, the isolated fault decoder loops through the logic of Algorithm 1. In the same manner described above with respect to FIG. 4-5, the isolated fault decoder pairs neighboring syndrome nodes 602, 604 and also pairs neighboring syndrome nodes 606 and 608. Connecting edges 614 and 616 are added to the solution set, and the syndrome nodes 602, 604, 606, and 608 are removed from the array of unpaired non-trivial nodes.

At this point in time, non-trivial syndrome nodes 610 and 612 both remain in the array of unpaired non-trivial syndrome nodes. The isolated fault decoder determines that the non-trivial syndrome node 610 is a boundary node in the decoding graph 600 and adds the half-edge 618 is added to the solution set. The isolated fault decoder further determines that the half-edge 618 is an ambiguous fault location due to the fact that the non-trivial syndrome node 610 is neighbors with another non-trivial syndrome node 604 that has already been paired, via the above logic, with the non-trivial syndrome node 602. It may be appreciated that the ambiguity in this scenario arises from the fact that the non-trivial syndrome node 610 can be explained by either a fault that occurred along the half-edge 618 or, instead, by a fault that occurred along an edge 624 between the non-trivial syndrome nodes 604 and 610.

After performing the above operations, the isolated fault decoder next determines that the node 612 is also a boundary node in the decoding graph 600 and adds the half edge 620 to the solution set. The half edge 620 does not represent an ambiguous fault location because it does not have any neighboring non-trivial syndrome nodes.

In the example of FIG. 6, the final solution set includes a single ambiguous fault represented in the solution set by the half-edge 618. Since no other faults are ambiguous, the isolated fault decoder can be certain that the solution set provides an accurate a complete set of fault locations. The isolated decoder returns the solution set representing the minimum weight fault path.

Figure 7:
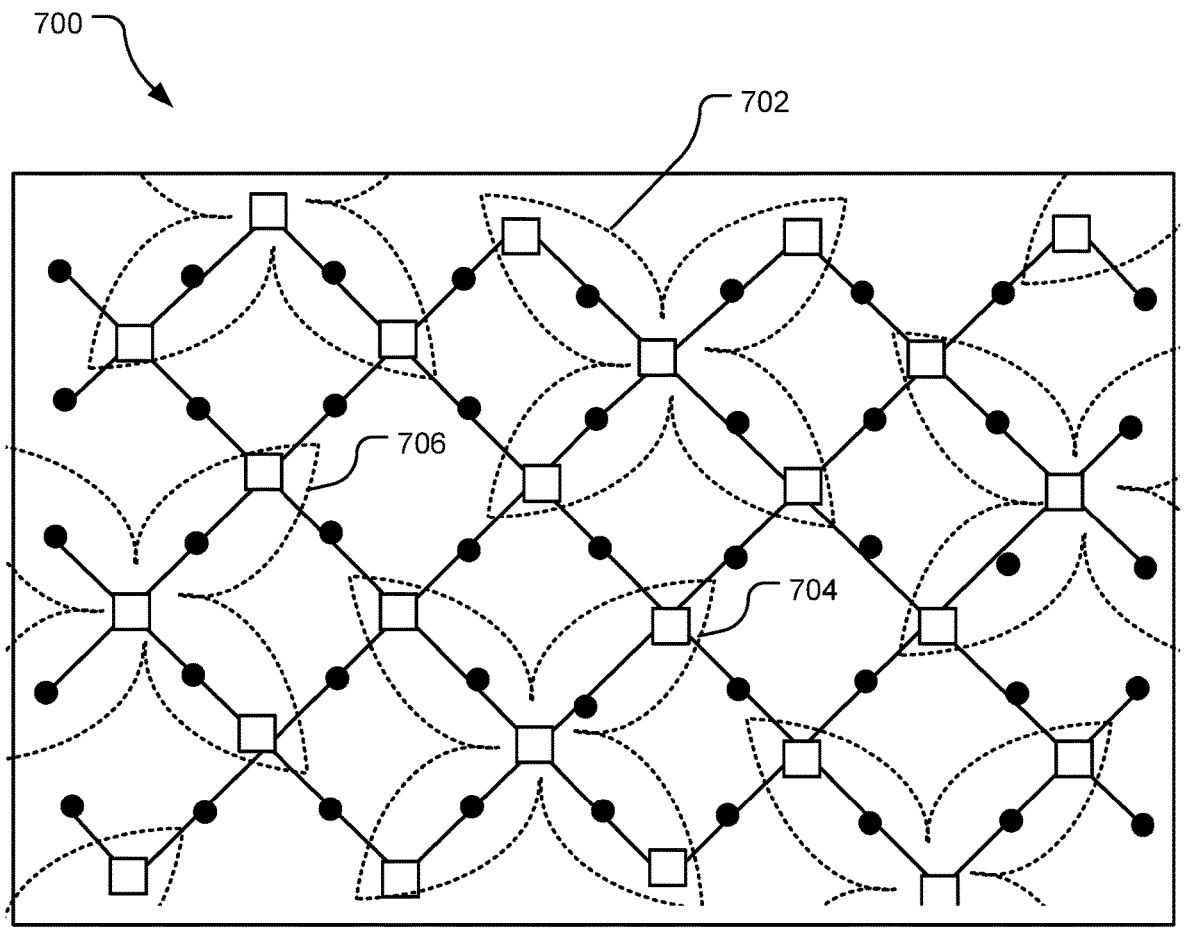
FIG. 7 illustrates an error-decoding scenario in which multiple instances of a same decoding algorithm are simultaneously instantiated on different subsets of a decoding graph.

FIG. 7 illustrates an error-decoding scenario in which multiple instances of a same decoding algorithm are simultaneously instantiated on different subsets of a decoding graph 700. Here, logic described herein as performed by the isolated fault decoder is broken down into several co-executable sub-modules that each operate on a different section of the decoding graph such that the sub-modules each operate concurrently on different subsets of nodes (e.g., subset of nodes encompassed by dotted patterns 702, 704, 706, etc.) in the decoding graph 700. This guarantees a high potential for parallelism. If faults are sufficiently separated from each other in space and time, a globally minimal solution can be obtained from locally optimal sub-solutions.

Figure 8:
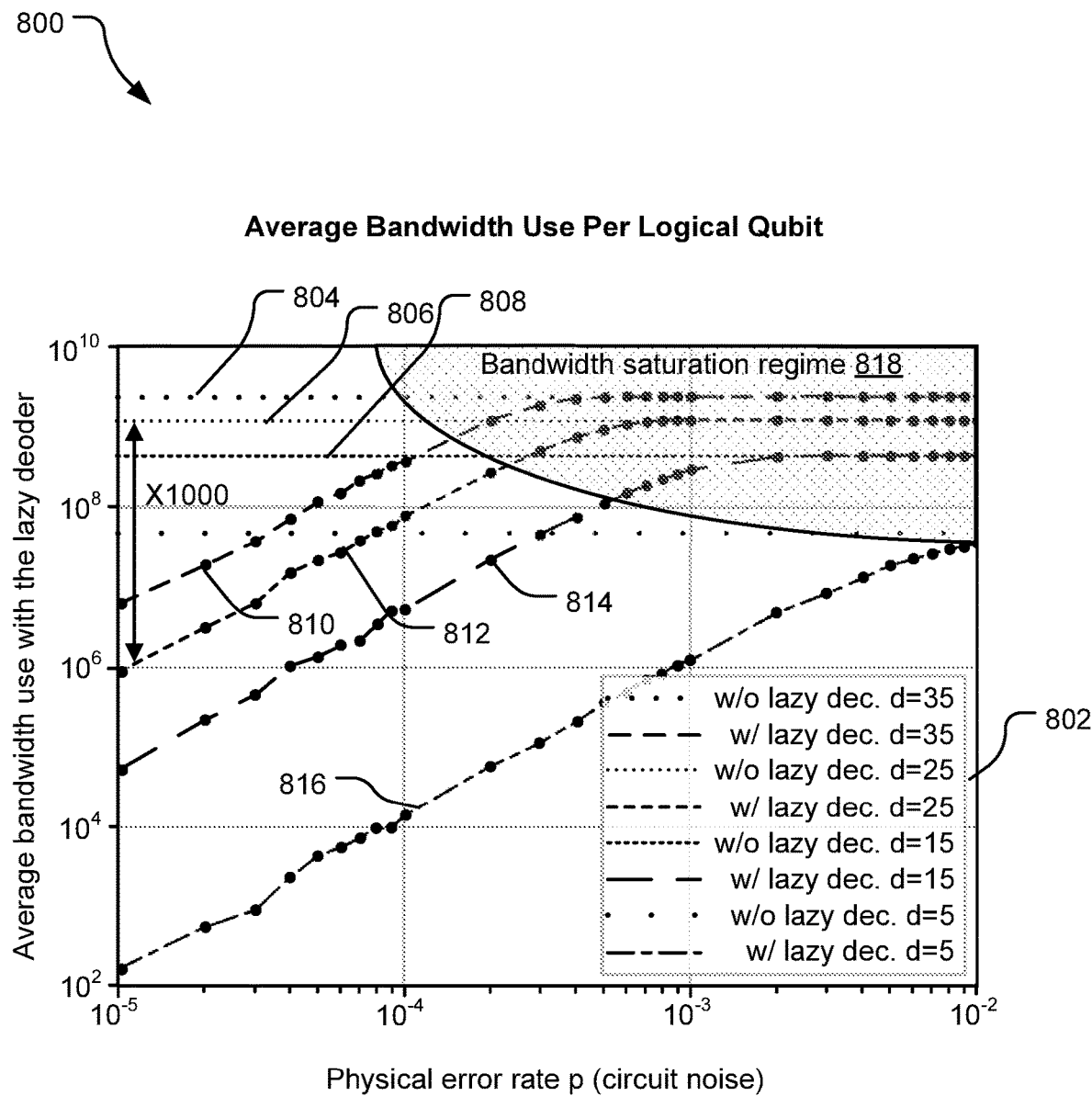
FIG. 8 illustrates a plot illustrating the average bandwidth used per logical qubit within various quantum computing systems that do and do not implement the herein-described isolated fault decoder logic.

FIG. 8 illustrates a plot 800 illustrating the average bandwidth used per logical qubit in Bit/s within quantum computing systems that do and do not implement the herein-described isolated fault decoder logic. Specifically, the plot 800 illustrates the effect of implementing the isolated fault decoder logic (e.g., of Table 1) in conjunction with surface codes of different distances (e.g., d=5, 15, 25, and 30) and also with respect to systems that achieve different physical target error rates (e.g., $p=10^{-5}, 10^{-4}, 10^{-3}, 10^{-2}$). As shown by the plot key 802, lines 804, 806, and 808 represent the average bandwidth used per logical qubit without the isolated fault decoder to achieve different target physical error rates while the remaining lines 810, 812, 814, and 816 indicate the average bandwidth used to achieve the same different physical target error rates when the isolated fault decoder is placed in a decoding pipeline as shown in FIG. 1 and described herein.

When the isolated fault decoder succeeds, the readout-decoding unit bandwidth used of a logical qubit drops to zero. With physical error rate $p=10^{-4}$, the average bandwidth savings varies between 1 order of magnitude for the distance 35 surface code to more than 3 orders of magnitude for the surface code of distance 5.

The plot 800 also illustrates a bandwidth saturation regime 818 indicating a zone of bandwidth saturation. This zone corresponds to surface codes of larger distance used in systems implementing with less stringent qubit quality requirements (e.g., target error rates of $10^{-3}$ or $10^{-2}$). In these cases, the isolated fault decoder fails almost constantly and little to no reduction in bandwidth is observed. This suggests a market need to continue improving qubit quality (e.g., into the $10^{-4}$ or $10^{-5}$ range) to scale up quantum hardware and its classical control to reach the regime of practical applications for the isolated fault decoder.

Figure 9:
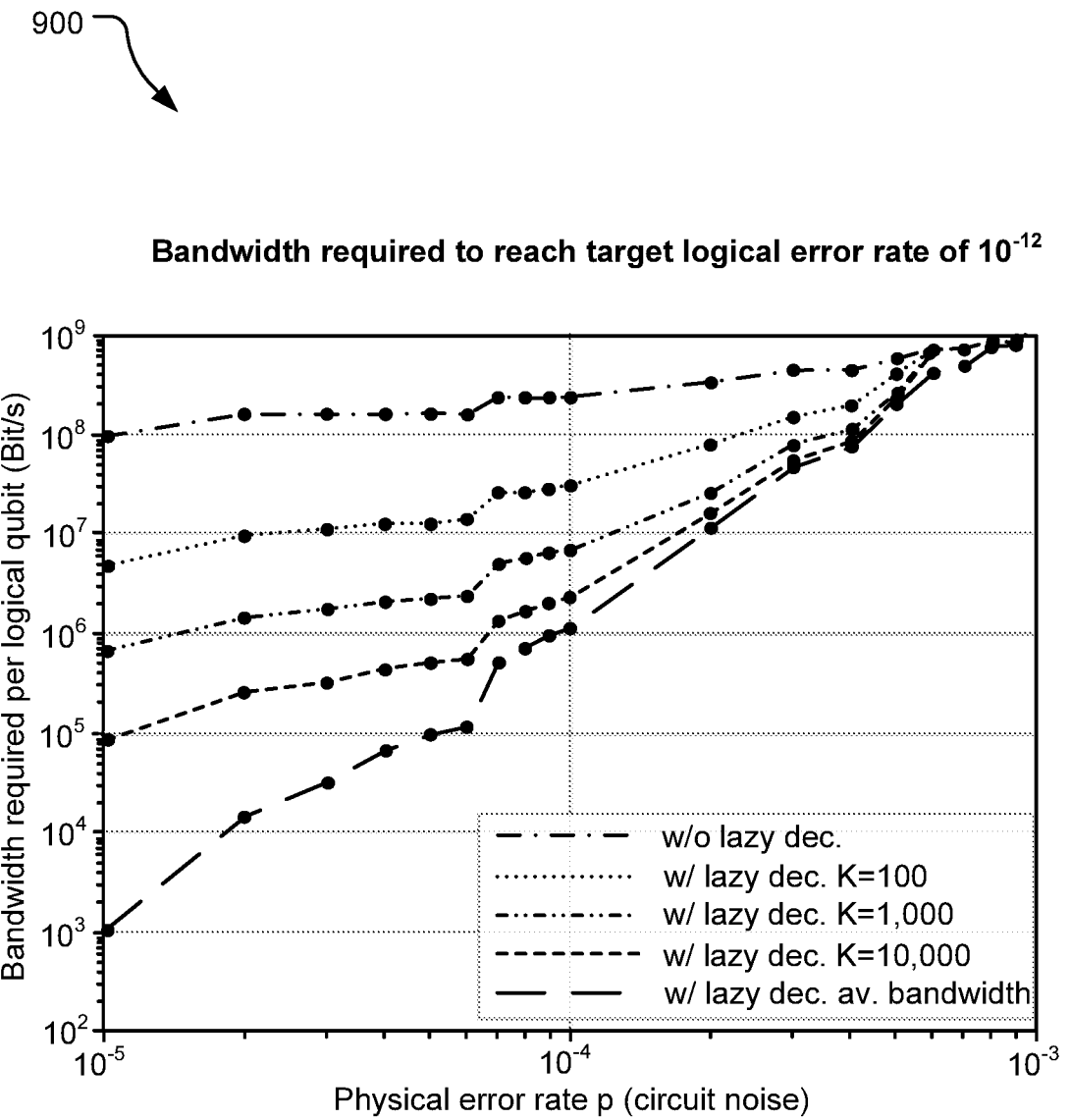
FIG. 9 illustrates a plot illustrating total bandwidth required per logical qubit in bits/s to reach a target logical error rate within various quantum computing systems that do and do not implement the herein-described isolated fault decoder logic.

FIG. 9 illustrates a plot 900 illustrating total bandwidth required per logical qubit in bits/s to reach a target logical error rate of $10^{-15}$. In contrast with FIG. 8 illustrating average bandwidth, the total bandwidth plot of FIG. 9 reflects the fact that the quantum computing system may sometimes require more bandwidth than the average use. The required bandwidth and the number of decoding units needed depends on the maximum number of failures of the isolated fault decoder over K logical qubits. The plot 900 assumes that each of the K qubits of the quantum computer are encoded with a distance-d surface code. As shown, a larger number of qubits allows for a better distribution of resources which drops the bandwidth required per logical qubits closer to the average bandwidth use.

Figure 10:
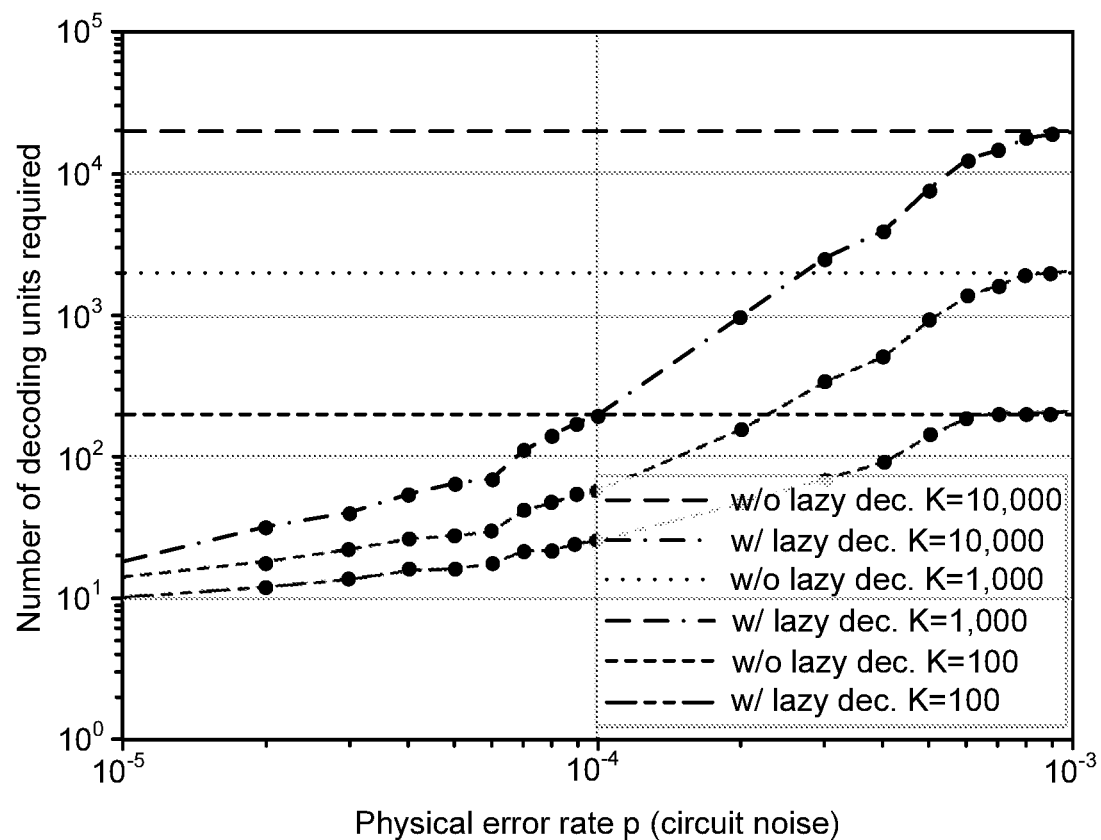
FIG. 10 illustrates plot showing a reduction in decoding hardware that may be realized by implementing an isolated fault decoder described herein in a quantum computing system with K logical qubits.

FIG. 10 illustrates plot 1000 showing a reduction in decoding hardware that may be realized by implementing the isolated fault decoder described herein in a quantum computing system with K logical qubits. In order to reach a target error rate of $10^{-15}$ with a system of k=10,0000 logical qubits with physical error rate $p=10^{-4}$, a naïve design uses 2k=20,000 decoding units while only 377 units are sufficient with the isolated fault decoder, saving 98% of total decoding hardware needed.

Figure 11:
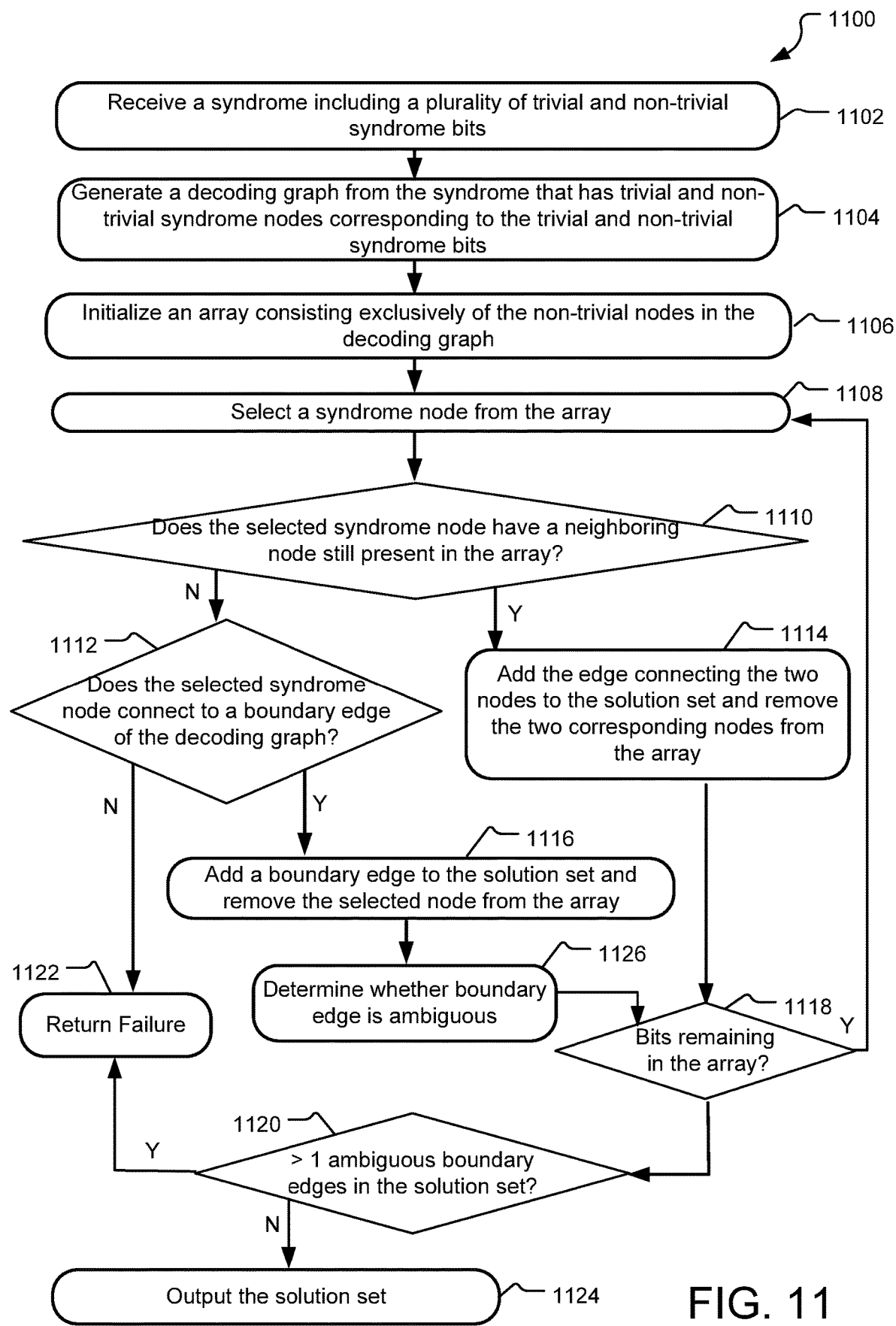
FIG. 11 illustrates example operations performed by an isolated fault decoder to significantly reduce bandwidth consumption and the amount of decoding hardware needed in a quantum computing system.

FIG. 11 illustrates example operations 1100 performed by an isolated fault decoder to significantly reduce bandwidth consumption and the amount of decoding hardware needed in a quantum computing system. A first receiving operation 1102 provides for receiving, at the isolated fault decoder, syndrome S from a measurement circuit in a quantum computing system. The syndrome S includes a plurality of trivial and non-trivial syndrome bits. A decoding graph generation operation 1104 generates a decoding graph based on the syndrome as generally discussed and described herein with respect to FIG. 3-7 above. An array initialization operation 1106 initializes an array consisting of the non-trivial nodes (corresponding to the non-trivial bits in the syndrome S), and a selection operation 1108 selects one of the non-trivial syndrome nodes from the array.

A first determination operation 1110 determines whether the selected non-trivial syndrome node has a neighboring non-trivial syndrome node on the decoding graph that is still remaining in the array. If such a neighboring node does not exist, a second determination operation 1112 determines whether the selected node connects to a boundary edge of the decoding graph. If the selected node does not correspond to a boundary edge, a failure mode return operation 1122 returns a failure mode and a more complex decoding unit attempts to solve the syndrome. If, on the other hand, the second determination operation 1112 determines that the selected node does connect to a boundary edge of the decoding graph, an array modification operation 1116 adds a boundary edge connected to the selected node to the solution set and removes the selected node from the array. A determination operation 1126 determines whether the boundary edge is ambiguous (e.g., represents an ambiguous fault location) and if so, tracks this information such as by incrementing a counter or other means. In this case, a third determination operation 1118 determines whether any nodes remain in the array and if so, the selection operation 1008 is re-executed to select a new node from the array. Here, the operations proceeding the selection operation 1108 are repeated as described above.

In cases where the first determination operation 1010 determines that the selected non-trivial syndrome node has a neighboring non-trivial syndrome node on the decoding graph that is still remaining in the array, another array modification operation 1114 adds a graph edge connecting the two neighboring nodes to the solution set and removes the two nodes from the array. In this case, the third determination operation 1118 determines whether any nodes remain in the array and if so, the selection operation 1008 is re-executed to select a new node from the array. Here, the operations proceeding the selection operation 1108 are repeated as described above.

Once no more bits remain in the array, a fourth determination operation 1120 determines whether the solution set includes more than one ambiguous boundary edge. If so, the failure mode return operation 1122 returns a failure mode. If not, an output operation 1124 outputs the solution set.

Figure 12:
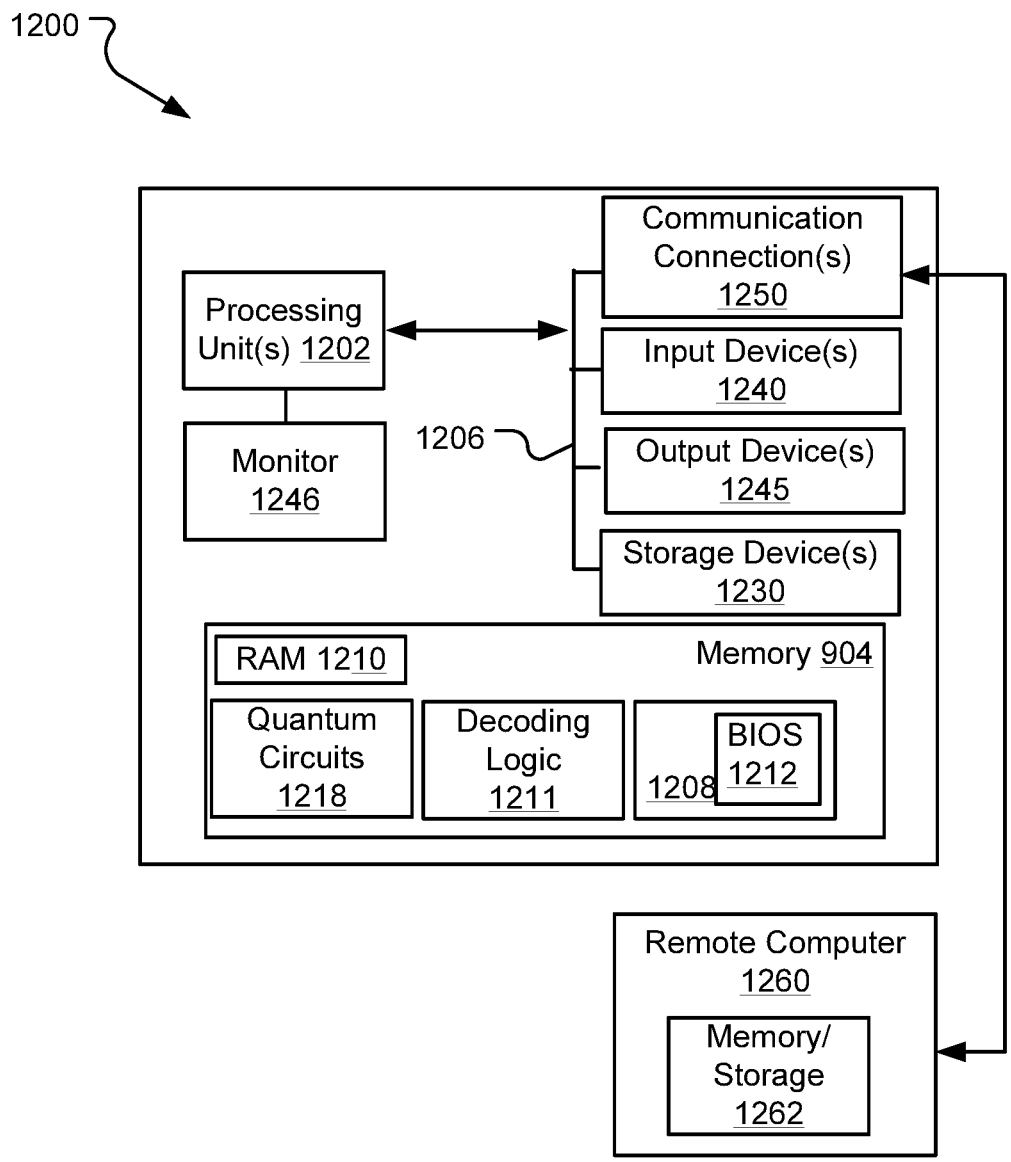
FIG. 12 illustrates exemplary computing environment suitable for implementing aspects of the disclosed technology.

FIG. 12 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices. Typically, a classical computing environment is coupled to a quantum computing environment, but a quantum computing environment is not shown in FIG. 12.

With reference to FIG. 12, an exemplary system for implementing the disclosed technology includes a general purpose computing device in the form of an exemplary conventional PC 1200, including one or more processing units 1202, a system memory 1204, and a system bus 1206 that couples various system components including the system memory 1204 to the one or more processing units 1202. The system bus 1206 may be any of several types of bus structures including a memory bus or memory controller, a peripheral bus, and a local bus using any of a variety of bus architectures. The exemplary system memory 1204 includes read only memory (ROM) 1208 and random access memory (RAM) 1210. A basic input/output system (BIOS) 1212, containing the basic routines that help with the transfer of information between elements within the PC 1200, is stored in ROM 1208.

In on implementation, the system memory 1204 stores decoding logic 1211, such as QECCs and logic specifically implemented by various system decoders (e.g., the isolated fault decoder 104 or primary decoder 106 of FIG. 1).

The exemplary PC 1200 further includes one or more storage devices 1230 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 1206 by a hard disk drive interface, a magnetic disk drive interface, and an optical drive interface, respectively. The drives and their associated computer readable media provide nonvolatile storage of computer-readable instructions, data structures, program modules, and other data for the PC 1200. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 1230 including an operating system, one or more application programs, other program modules, and program data. Decoding logic can be stored in the storage devices 1230 as well as or in addition to the memory 1204. A user may enter commands and information into the PC 1200 through one or more input devices 1240 such as a keyboard and a pointing device such as a mouse. Other input devices may include a digital camera, microphone, joystick, game pad, satellite dish, scanner, or the like. These and other input devices are often connected to the one or more processing units 1202 through a serial port interface that is coupled to the system bus 1206, but may be connected by other interfaces such as a parallel port, game port, or universal serial bus (USB). A monitor 1246 or other type of display device is also connected to the system bus 1206 via an interface, such as a video adapter. Other peripheral output devices 1245, such as speakers and printers (not shown), may be included.

The PC 1200 may operate in a networked environment using logical connections to one or more remote computers, such as a remote computer 1260. In some examples, one or more network or communication connections 1250 are included. The remote computer 1260 may be another PC, a server, a router, a network PC, or a peer device or other common network node, and typically includes many or all of the elements described above relative to the PC 1200, although only a memory storage device 1262 has been illustrated in FIG. 12. The personal computer 1200 and/or the remote computer 1260 can be connected to a logical a local area network (LAN) and a wide area network (WAN). Such networking environments are commonplace in offices, enterprise wide computer networks, intranets, and the Internet.

When used in a LAN networking environment, the PC 1200 is connected to the LAN through a network interface. When used in a WAN networking environment, the PC 1200 typically includes a modem or other means for establishing communications over the WAN, such as the Internet. In a networked environment, program modules depicted relative to the personal computer 1200, or portions thereof, may be stored in the remote memory storage device or other locations on the LAN or WAN. The network connections shown are exemplary, and other means of establishing a communications link between the computers may be used.

An example method disclosed herein provides for receiving from a measurement circuit a syndrome including a plurality of trivial and non-trivial syndrome bits providing information about one or more errors of a given type detected by measuring one or more qubits in a qubit register. The method further provides for implementing, at an isolated fault decoder, logic to identify set of faults that explain the syndrome while also satisfy a fault isolation threshold restricting a proximity between each pair of fault in the set.

Another example method of any preceding method provides for outputting error solution information identifying a fault location within the qubit register that accounts for each of the non-trivial syndrome bits in the syndrome responsive to identification of the set of faults satisfying the fault isolation threshold.

In yet still another example method of any preceding method, implementing the logic to identify the set of faults further comprises: generating a decoding graph from the syndrome that defines nodes and edges such that the nodes correspond to the trivial and non-trivial syndrome bits and are arranged relative to one another to correspond to respective relative locations in the measurement circuit.

In still another example method of any preceding method, wherein the fault isolation threshold is satisfied when each fault in the set is separated from the remaining faults in the set by at least one edge in the decoding graph.

In yet still another example method of any preceding method, implementing the logic to identify the set of faults satisfying the fault isolation threshold further comprises: pairing together non-trivial syndrome bits in the syndrome that correspond to neighboring nodes in the decoding graph, and outputting error solution information when fewer than two of the non-trivial syndrome bits are identified as corresponding to ambiguous fault locations in the decoding graph and all other non-trivial syndrome bits are paired via the pairing operation.

In still another example method of any preceding method, the method further comprises: outputting a failure mode when two or more of the non-trivial syndrome bits in the syndrome are identified as corresponding to ambiguous fault locations in the decoding graph.

In still another example method of any preceding method, the method further comprises outputting a failure mode responsive to identifying a non-trivial syndrome bit that cannot be paired via the pairing operation and that also does not correspond to a boundary edge in the decoding graph.

In still another example method of any preceding method, the method further provides for providing the syndrome to a primary decoder responsive to a failure to identify the set of faults satisfying the fault isolation threshold, the primary decoder implementing a quantum error correction code that is at least one of more processor-intensive or more memory intensive than the logic implemented by the isolated fault decoder.

In yet still another example method of any preceding method, implementing the logic to identify the set of faults satisfying the fault isolation threshold further comprises co-executing different instances of a same decoding module on different subsets of a decoding graph generated based on the syndrome.

In still another example method of any preceding method, the set of faults define a minimum weight fault path.

An example system disclosed herein includes an isolated fault decoder configured to: receive a syndrome from a measurement circuit, the syndrome including a plurality of trivial and non-trivial syndrome bits providing information about one or more errors of a given type detected by measuring one or more qubits in a qubit register; and implement logic to identify a set of faults and associated fault locations that explain the syndrome while also satisfying a fault isolation threshold restricting a proximity between each pair of faults in the set.

In another example system of any preceding system, the isolated fault decoder is further executable to: output error solution information identifying a fault location within the qubit register that accounts for each of the non-trivial syndrome bits in the syndrome responsive to identifying of the set of faults satisfying the fault isolation threshold.

In yet still another example system according to any preceding system, the isolated fault decoder is further executable to generate a decoding graph from the syndrome, the decoding graph defining nodes and edges. Within the decoding graph, the nodes corresponding to the trivial and non-trivial syndrome bits and are arranged relative to one another to correspond to respective relative locations in the measurement circuit.

In another example system of any preceding system, the fault isolation threshold is satisfied when each fault in the identified set is separated from the remaining faults in the identified set by at least one edge in the decoding graph.

In still another example system of any preceding system, the logic implemented by the isolated fault decoder further provides for: pairing together non-trivial syndrome bits in the syndrome that correspond to neighboring nodes in the decoding graph and outputting error solution information when fewer than two of the non-trivial syndrome bits are identified as corresponding to ambiguous fault locations in the decoding graph and all other non-trivial syndrome bits are paired via the pairing operation.

In still another example system of any preceding system, the isolated fault decoder outputs a failure mode when two or more of the non-trivial syndrome bits in the syndrome are identified as corresponding to ambiguous fault locations in the decoding graph.

In still another example system of any preceding system, the isolated fault decoder is further executable to: output a failure mode responsive to identification of a non-trivial syndrome bit that cannot be paired via the pairing operation and that also does not correspond to an ambiguous boundary edge in the decoding graph.

Still another example system of any preceding system further comprises a primary decoder that receives the syndrome when the isolated fault decoder outputs a failure mode, the primary decoder implementing a quantum error correction code that is at least one of more processor-intensive or more memory intensive than the logic implemented by the isolated fault decoder.

An example memory device disclosed herein encodes computer-executable instructions for executing a computer process comprising: accepting as an input from a measurement circuit a syndrome including a plurality of trivial and non-trivial syndrome bits providing information about one or more errors of a given type detected by measuring one or more qubits in a qubit register, and identifying a set of faults and associated fault locations that explain the syndrome while also satisfying a fault isolation threshold restricting a proximity between each pair of faults in the set.

In another example memory device according to any preceding memory device, the fault isolation threshold is satisfied when each fault in the identified set is separated from the remaining faults in the identified set by at least one edge in a decoding graph generated based on the syndrome.

An example system disclosed herein includes a means for receiving a syndrome from a measurement circuit and a means for identifying a set of faults and associated fault locations that explain the syndrome while also satisfying a fault isolation threshold restricting a proximity between each pair of faults in the set. The syndrome includes a plurality of trivial and non-trivial syndrome bits providing information about one or more errors of a given type detected by measuring one or more qubits in a qubit register.

The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims. The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims.

What is claimed is:

1. A method comprising:
   receiving from a measurement circuit a syndrome including a plurality of syndrome bits, each of the syndrome bits corresponding to an ancilla qubit that is entangled with multiple neighboring data qubits, the ancilla qubit being measurable to provide quantum state information about each of multiple neighboring data qubits,
   each of the syndrome bits in the received syndrome being either:
      of a first binary state indicative of non-detection of a fault at a circuit detection location corresponding to the multiple neighboring qubits or
      a second binary state indicative of at least one fault detected at the circuit detection location, each fault of the at least one fault detected having a fault location corresponding to an unknown one of the multiple neighboring qubits; and
   implementing, at an isolated fault decoder, logic to identify a set of fault locations that explain the syndrome received from the measurement circuit, each fault in the set of fault locations identifying a location where a fault occurred, the set of fault locations collectively satisfying a fault isolation threshold restricting a proximity between each pair of fault locations in the set.

2. The method of claim 1, further comprising:
   responsive to identification of the set of faults satisfying the fault isolation threshold, outputting error solution information identifying a fault location within the qubit register that accounts for each of the syndrome bits of the second binary state in the syndrome.

3. The method of claim 1, wherein implementing the logic to identify the set of faults further comprises:
   generating a decoding graph from the syndrome, the decoding graph defining nodes and edges, the nodes corresponding to the syndrome bits and arranged relative to one another to correspond to respective relative locations in the measurement circuit.

4. The method of claim 3, wherein the fault isolation threshold is satisfied when each fault in the set is separated from the remaining faults in the set by at least one edge in the decoding graph.

5. The method of claim 3, wherein implementing the logic to identify the set of faults satisfying the fault isolation threshold further comprises:
   pairing together syndrome bits of the second binary state in the syndrome that correspond to neighboring nodes in the decoding graph; and
   outputting error solution information when fewer than two of the syndrome bits of the second binary state are identified as corresponding to ambiguous fault locations in the decoding graph and all other syndrome bits of the second binary state are paired via the pairing operation.

6. The method of claim 5, further comprising:
   outputting a failure mode when two or more of the syndrome bits of the second binary state are identified as corresponding to ambiguous fault locations.

7. The method of claim 5, further comprising:
   outputting a failure mode responsive to identification of a syndrome bit of the second binary state that cannot be paired via the pairing operation and that also does not correspond to an ambiguous fault location in the decoding graph.

8. The method of claim 1, further comprising:
   responsive to a failure to identify the set of faults satisfying the fault isolation threshold, providing the syndrome to a primary decoder implementing a quantum error correction code that is at least one of more processor-intensive or more memory intensive than the logic implemented by the isolated fault decoder.

9. The method of claim 1, wherein implementing the logic to identify the set faults satisfying the fault isolation threshold further comprises:
   co-executing different instances of a same decoding module on different subsets of a decoding graph generated based on the syndrome.

10. The method of claim 1, wherein the set of faults define a minimum weight fault path.

11. A system comprising:
    an isolated fault decoder configured to:
    receive from a measurement circuit a syndrome including a plurality of syndrome bits, each of the syndrome bits corresponding to an ancilla qubit that is entangled with multiple neighboring data qubits, the ancilla qubit being measurable to provide quantum state information about each of the multiple neighboring data qubits,
    each of the syndrome bits in the received syndrome being either of a first binary state indicative of non-detection of a fault at a circuit detection location corresponding to the multiple neighboring qubits or a second binary state indicative of at least one fault detected at the circuit detection location, each fault of the at least one fault detected having a fault location corresponding to an unknown one of the multiple neighboring qubits; and
    implement logic to identify a set of fault locations that explain the syndrome observed for the measurement circuit, each fault in the set of fault locations identifying a location where a fault occurred, the set of fault locations collectively satisfying a fault isolation threshold restricting a proximity between each pair of fault locations in the set.

12. The system of claim 11, wherein the isolated fault decoder is further configured to:
    output error solution information identifying one or more fault locations within the qubit register responsive to identifying of the set of faults satisfying the fault isolation threshold.

13. The system of claim 11, wherein the isolated fault decoder is further configured to:

generate a decoding graph from the syndrome, the decoding graph defining nodes and edges, the nodes corresponding to the trivial syndrome bits and arranged relative to one another to correspond to respective relative locations in the measurement circuit.

14. The system of claim 13, wherein the fault isolation threshold is satisfied when each fault in the identified set is separated from the remaining faults in the set by at least one edge in the decoding graph.

15. The system of claim 13, where the logic implemented by the isolated fault decoder further provides for:
pairing together syndrome bits of the second binary state in the syndrome that correspond to neighboring nodes in the decoding graph; and
outputting error solution information when fewer than two of the syndrome bits of the second binary state are identified as corresponding to ambiguous fault locations in the decoding graph and all other syndrome bits of the second binary state are paired via the pairing operation.

16. The system of claim 13, wherein the isolated fault decoder is further configured to:
output a failure mode when two or more of the syndrome bits of the second binary state in the syndrome are identified as corresponding to ambiguous fault locations.

17. The system of claim 13, wherein the isolated fault decoder is further configured to:
output a failure mode responsive to identifying of a syndrome bit of the second binary state that cannot be paired via the pairing operation and that also does not correspond to an ambiguous fault location.

18. The system of claim 11, further comprising:
a primary decoder that receives the syndrome when the isolated fault decoder outputs a failure mode, the primary decoder implementing a quantum error correction code that is at least one of more processor-intensive or more memory intensive than the logic implemented by the isolated fault decoder.

19. One or more memory devices implementing computer-executable instructions for executing a computer process comprising:
accepting as an input from a measurement circuit a syndrome including a plurality of syndrome bits, each of the syndrome bits corresponding to an ancilla qubit that is entangled with multiple neighboring data qubits, the ancilla qubit being measurable to provide quantum state information about each of the multiple neighboring data qubits,
each of the syndrome bits in the received syndrome being either of:
a first binary state indicative of non-detection of a fault at a circuit detection location corresponding the multiple neighboring qubits or
a second binary state indicative of at least one fault detected at the circuit detection location, each fault of the at least one fault detected having a fault location corresponding to an unknown one of the multiple neighboring qubits; and
identifying a set of fault locations that explain the syndrome received from the measurement circuit, each fault in the set of fault locations identifying a location where the fault occurred, the set of fault locations collectively satisfying a fault isolation threshold restricting a proximity between each pair of fault locations in the set.

20. The one or more memory devices of claim 19, wherein the fault isolation threshold is satisfied when each fault in the identified set is separated from the remaining faults in the identified set by at least one edge in a decoding graph generated based on the syndrome.

* * * * *